United States Patent
Kim et al.

(10) Patent No.: US 7,407,860 B2
(45) Date of Patent: Aug. 5, 2008

(54) METHOD OF FABRICATING A COMPLEMENTARY SEMICONDUCTOR DEVICE HAVING A STRAINED CHANNEL P-TRANSISTOR

(75) Inventors: Young Suk Kim, Kawasaki (JP); Toshifumi Mori, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 310 days.

(21) Appl. No.: 11/098,567

(22) Filed: Apr. 5, 2005

(65) Prior Publication Data
US 2005/0266631 A1     Dec. 1, 2005

(30) Foreign Application Priority Data
May 26, 2004  (JP) .............................. 2004-156569
Feb. 23, 2005 (JP) .............................. 2005-046573

(51) Int. Cl.
   *H01L 21/336*   (2006.01)
   *H01L 21/76*    (2006.01)
(52) U.S. Cl. ....................................... 438/300; 438/429
(58) Field of Classification Search ................ None
   See application file for complete search history.

(56) References Cited

U.S. PATENT DOCUMENTS

| | | | |
|---|---|---|---|
| 5,124,272 A * | 6/1992 | Saito et al. ................... | 438/297 |
| 6,621,131 B2 | 9/2003 | Murthy et al. | |
| 6,797,556 B2 * | 9/2004 | Murthy et al. .............. | 438/231 |
| 6,891,192 B2 * | 5/2005 | Chen et al. ..................... | 257/49 |
| 7,112,495 B2 * | 9/2006 | Ko et al. ....................... | 438/300 |
| 7,176,481 B2 * | 2/2007 | Chen et al. .................... | 257/19 |

* cited by examiner

*Primary Examiner*—Zandra Smith
*Assistant Examiner*—Khanh B Duong
(74) *Attorney, Agent, or Firm*—Westerman, Hattori, Daniels & Adrian, L.L.P.

(57) ABSTRACT

Compression stress applying portions 20 of SiGe film are formed in the source/drain regions of the p-MOSA region 30a. Then, impurities are implanted in the p-MOS region 30a and the n-MOS region 30b to form shallow junction regions 22a, 22b and deep junction regions 23a, 23b. The impurity in the shallow junction regions 22a, 22b is prevented from being diffused immediately below the gate insulation film 15 by the thermal processing in forming the SiGe film, the short channel effect is prevented, and the hole mobility of the channel region of the p-MOS transistor 14a. The operation speed of the p-MOS transistor 13a is balanced with that of the n-MOS transistor, whereby the operation speed of the complementary semiconductor device 10 can be increased. The semiconductor device fabricating method can increase and balance the operation speed of a p-transistor with that of an n-transistor.

14 Claims, 32 Drawing Sheets

METHOD OF FABRICATING A COMPLEMENTARY SEMICONDUCTOR DEVICE HAVING A STRAINED CHANNEL P-TRANSISTOR

CROSS-REFERENCE TO RELATED APPLICATIONS

This application is based upon and claims priorities of Japanese Patent Application No. 2004-156569 filed on May 26, 2004 and Japanese Patent Application No. 2005-46573 filed on Feb. 23, 2005, the contents being incorporated herein by reference.

BACKGROUND OF THE INVENTION

The present invention relates to a semiconductor device fabricating method for fabricating a semiconductor device of complementary MIS (Metal Insulation Semiconductor) type having compression strain induced in the channel of the p-transistor.

In semiconductor devices, for high achievements, as of speedy operation, low power consumption and high integration, etc., the minimum processing dimension has been increasingly nanonized. In the generation of the minimum processing dimensions of below 65 nm including 65 nm, the nanonization is technologically very difficult, and the higher achievements resorting to the nanonization alone are being limited.

Here, as a high achievement transistor which does not resort to the nanonization is noted the so-called strained silicon transistor having strain induced in the silicon single crystal of the channel of the MIS or MOS transistor. In the strained silicon transistor, an Si single crystal film is formed on an SiGe film whose lattice constant is larger than that of the Si single crystal, whereby the electron mobility of the Si single crystal film can be improved. The n-transistor using such strained Si single crystal film as the channel to thereby improve the operation speed is proposed.

The hole mobility (1900 $cm^2/(V*s)$) in the usual Si single crystal is lower than the electron mobility (3900 $cm^2/(V*s)$). In the complementary semiconductor device including a p-transistor and an n-transistor, the operation speed of the p-transistor is lower, which makes low the operation speed of the semiconductor device as a whole. Furthermore, even when the operation speed of the n-transistor by using a strained silicon substrate, the operation speed of the semiconductor device as a whole cannot be achieved, but the cost increase, etc. by the use of the strained silicon substrate are problems.

To improve the operation speed of the p-transistor, as illustrated in FIG. 1, a semiconductor device including an SiGe film 101, 102 in the source/drain regions of the p-transistor to thereby apply compressive strain to the channel (Si single crystal) 104 below the gate oxide film 103 by the SiGe films 101, 102 to improve the hole mobility is proposed (refer to Patent Reference 1). Patent Reference 1 is U.S. Pat. No. 6,621,131.

In Patent Reference 1, impurity diffused regions each formed of a shallow junction region 105 and a deep junction region 106 of a p-transistor are formed, then trenches 101a, 102a are formed in the source/drain regions, and the SiGe film 101, 102 is formed on the surfaces of the trenches 101a, 102a by thermal CVD.

However, when the SiGe film 101, 102 is formed after the impurity diffused regions have been formed, the thermal processing is performed up to about 740 C, which diffuses the impurity, and short channel effect takes place. Especially, the transistor whose gate length is below 100 nm including 100 nm has the problem that the roll off characteristics of the threshold voltage is deteriorated.

Patent Reference 1 does not disclose a specific method for fabricating a complementary semiconductor device including a p-transistor and an n-transistor.

SUMMARY OF THE INVENTION

An object of the present invention is to provide an innovational method for fabricating a semiconductor device having the operation speed of the p-transistor improved and balanced with the operation speed of the n-transistor.

According to one aspect of the present invention, the present invention provides a semiconductor device fabricating method for fabricating a semiconductor device including a p-transistor formed in a first region of a semiconductor substrate, and an n-transistor formed in a second region of the semiconductor substrate, comprising the steps of: forming a first gate layer structure including a gate insulation film and a gate electrode in the first region and a second gate layer structure including a gate insulation film and a gate electrode in the second region; forming a first sidewall insulation film on both side surfaces of the first gate layer structure; forming a trench in the semiconductor substrate outer of the first sidewall insulation film with the surface of the semiconductor substrate in the first region with the first sidewall insulation film as a mask, the second region covered with an etching resistant film and; forming a compressive stress applying portion in the trench; removing the first sidewall insulation film in the first region; forming a first junction region in the first region and the second region with the first gate layer structure and the second gate layer structure as a mask; forming a second sidewall insulation film on both side surfaces of the first gate layer structure and a third sidewall insulation film on both side surfaces of the second gate layer structure; and forming a second junction region in the first region and the second region with the first gate layer structure and the second sidewall insulation film and the second gate layer structure and the third sidewall insulation film as a mask.

According to another aspect of the present invention, the impurity implantation for forming the fist junction regions and the second junction regions is performed after the compressive stress applying portions have been formed, whereby the impurities, especially the impurity in the first junction regions is prevented from being diffused immediately below the gate insulation film by the thermal processing for forming the compressive stress applying portions. Accordingly, the short channel effect can be prevented, and the hole mobility of the channel region of the p-transistor is increased, whereby the operation speed of the p-transistor is balanced with that of the n-transistor to thereby increase the operation speed of the complementary semiconductor device as a whole. The drain current of the p-transistor can be increased, and also in the drain current, the characteristics of the p-transistor can be balanced with those of the n-transistor.

According to another aspect of the present invention, the present invention provides a semiconductor device fabricating method for fabricating a semiconductor device including a p-transistor formed in a first region of a semiconductor substrate, and an n-transistor formed in a second region of the semiconductor substrate, comprising the steps of: forming a first gate layer structure including a gate insulation film and a gate electrode in the first region and a second gate layer structure including a gate insulation film and a gate electrode in the second region; forming a first sidewall insulation film on both side surfaces of the first gate layer structure; performing a first surface processing in which $CF_4$ gas and $O_2$ gas are electrolytically dissociated and applied, the second region covered with a resist film, to thereby deform the surface of the semiconductor substrate outer of the first sidewall insulation film in the first region to form a first deformed film thereon; performing a second surface processing in which $O_2$ gas is electrolytically dissociated and applied to thereby remove the resist film in the second region, and to further deform the first deformed film to form a second deformed film and to oxide the surface of the semiconductor substrate exposed in the second region to form an oxide film thereon; forming a trench in the semiconductor substrate outer of the first sidewall insulation film with the surface of the semiconductor substrate in the first region with the first gate layer structure and the first sidewall insulation film in the first region and the second gate layer structure and the oxide film in the second region as a mask; forming a compressive stress applying portion in the trench; removing the first sidewall insulation film in the first region; forming a first junction region in the first region and the second region with the first gate layer structure and the second gate layer structure as a mask; forming a second sidewall insulation film on both side surfaces of the first gate layer structure and a third sidewall insulation film on both side surfaces of the second gate layer structure; and forming a second junction region in the first region and the second region with the first gate layer structure and the second sidewall insulation film and the second gate layer structure and the third sidewall insulation film as a mask.

According to another aspect of the present invention, in addition to the above-described effects of the present invention, oxide film is formed on the surface of the semiconductor substrate in the second region by the first surface processing and the second surface processing, while an ashing deformed film which is inferior to the oxide film in hydrofluoric acid resistance is formed on the surface of the first region. That is, films which are different in the etching selectivity to hydrofluoric acid aqueous solution are formed on the surface of the semiconductor substrate in the first region and the second region. Accordingly, the surface of the semiconductor substrate only in the first region can be exposed by the hydrofluoric acid processing with the surface of the semiconductor device in the second region masked with the oxide film, which facilitates forming the trenches where the compressive stress applying portions are to be formed.

According to the present invention, a semiconductor device having the operation speed of the p-transistor increased and balanced with the operation speed of the n-transistor can be realized.

DETAILED DESCRIPTION OF THE INVENTION

A First Embodiment

Figure 2:
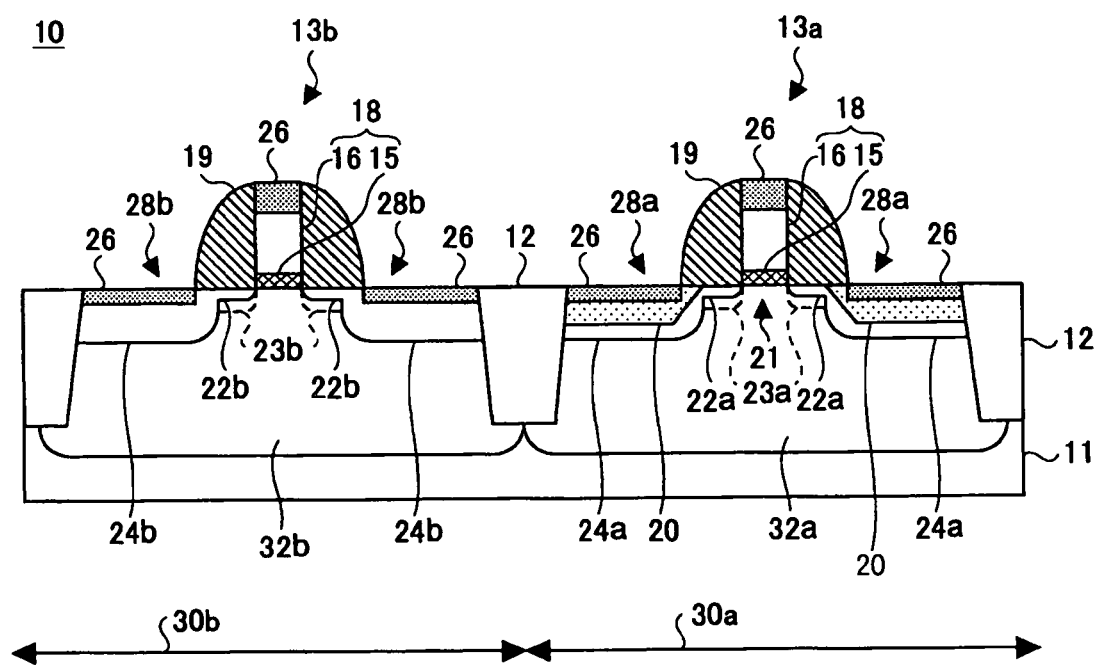
FIG. 2 is a sectional view of a semiconductor device fabricated by the semiconductor device fabricating method according to a first embodiment of the present invention.

A semiconductor device fabricating method according to a first embodiment of the present invention will be explained with reference to FIGS. 2 to 17. FIG. 2 is a sectional view of a semiconductor device fabricated by the semiconductor device fabricating method according to the first embodiment of the present invention. FIGS. 3 to 17 are sectional view of the semiconductor device in the steps of the semiconductor fabricating method according to the present embodiment, which illustrate the method.

With reference to FIG. 2, the semiconductor device 10 comprises a p-MOS transistor 13a and an n-MOS transistor 13b spaced from each other by a device isolation region 12. In the p-MOS transistor 13a, compressive stress applying portions 20 of, e.g., SiGe are formed outward from the surfaces of the silicon substrate 11 in contact with a third sidewall insulation film 19 formed on both side surfaces of a gate layer structure 18 formed of a gate insulation film 15 and a gate electrode 16 and sandwiches a compressive stress inducing portion 21 of Si below the gate layer structure 18 and the third sidewall insulation film at both sides thereof. Because of the SiGe film of the compressive stress applying portions 20, whose lattice constant is larger than that of Si, the compressive stress applying portions 20 apply a stress toward the channel region, and a compression stress is induced in the channel region. Resultantly, the hole mobility of the channel region is improved, and the operation speed of the p-MOS transistor 13a is made possible.

In the present embodiment, the region where the p-MOS transistor 13a is to be formed is called a p-MOS transistor region, and the region where the n-MOS transistor 13b is to be formed is called an n-MOS region 30b. The method for fabricating the semiconductor device 10 will be detailed below.

FIGS. 3 to 17 are sectional views of the semiconductor device 10 in the steps of the semiconductor device fabricating method according to the first embodiment, which illustrate the method.

Figure 3:
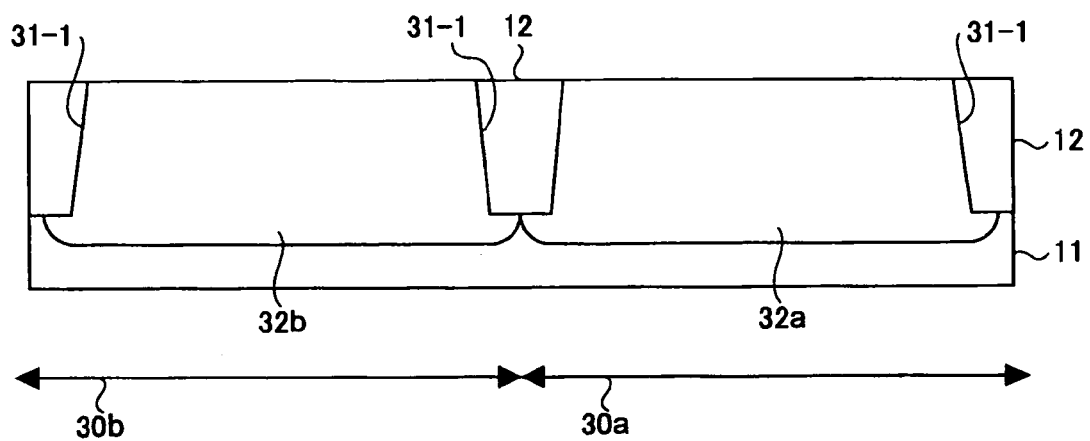
FIG. 3 is a sectional view of the semiconductor device in the step of the semiconductor device fabricating method according to the first embodiment of the present invention (Part 1).

First, in the step of FIG. 3, the device isolation region 12 is formed in the silicon substrate 11 by STI (Shallow Trench Isolation). Specifically, the device isolation film 12 is formed by forming a trench 13-1 in the silicon substrate 11 by trench etching, thermally oxidizing the inside wall of the trench 13-1, burying a silicon oxide film by CVD and planarizing the silicon oxide film.

The silicon substrate 11 may be a bulk substrate or an SOI (Silicon On Insulator) substrate. The use of an SOI substrate decreases the parasitic capacitance due to the depletion layer generated between the source/drain region which will be formed in a later step and the substrate to thereby improve the operation speed of the transistor. The STI is the known method.

In the step of FIG. 3, furthermore, an n-impurity ions, such as $As^+$, $P^+$ or others, are implanted in a p-MOS region 30a in the silicon substrate 11 by ion implantation, and in an n-MOS region 30b, a p-impurity ions, such as $B^+$, $BF_2^+$ or others, are implanted. Thus, an n-well region 32a and a p-well region 32b are formed.

Figure 4:
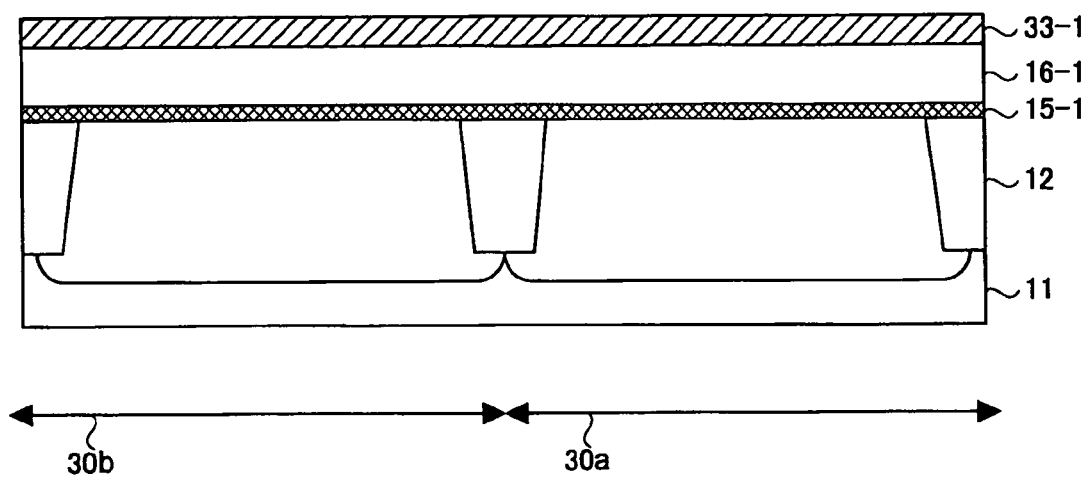
FIG. 4 is a sectional view of the semiconductor device in the step of the semiconductor device fabricating method according to the first embodiment of the present invention (Part 2).

Next, in the step of FIG. 4, natural silicon oxide film (not illustrated) on the surface of the silicon substrate 11 is removed by HF (hydrofluoric acid) processing, and a silicon oxide film 15-1 (to be a gate insulation film) of, e.g., 1.2 nm-thickness is formed by CVD, sputtering or thermal oxidation. Specifically, the thermal oxidation is performed, e.g., in an oxygen atmosphere, at 600-1100° C. and for 1-20 minutes, and the silicon oxide film 15-1 is formed in a 0.5-3 nm-thickness.

In place of the silicon oxide film 15-1, silicon oxide nitride film or silicon nitride film may be used, and a layer film of such film and silicon oxide film may be used. Know insulation film can be used.

In the step of FIG. 4, furthermore, a non-doped polysilicon film 16-1 (to be gate electrodes) of a 100 nm-thickness is formed on the silicon oxide film 15-1 by CVD. Specifically, the polysilicon film 16-1 of a 20-200 nm-thickness is formed by, e.g., low pressure CVD under a 10-50 Pa internal pressure of the chamber, at a 600-650° C. substrate temperature, at 50-300 sccm flow rate of monosilane gas for 5-6 minutes. $PH_3$ gas or others may be mixed to form a doped polysilicon film doped with $P^+$ or $B^+$.

In the step of FIG. 4, furthermore, a silicon nitride film 33-1 (to be a cap layer) of a 10-50 nm-thickness is formed on the polysilicon film 16-1 by CVD. Specifically, the silicon nitride film 33-1 is formed, e.g., at a 650° C. substrate temperature, at a 20 Pa pressure and with dichlorosilane gas (660 sccm flow rate) and ammonia gas (870 sccm flow rate).

Figure 5:
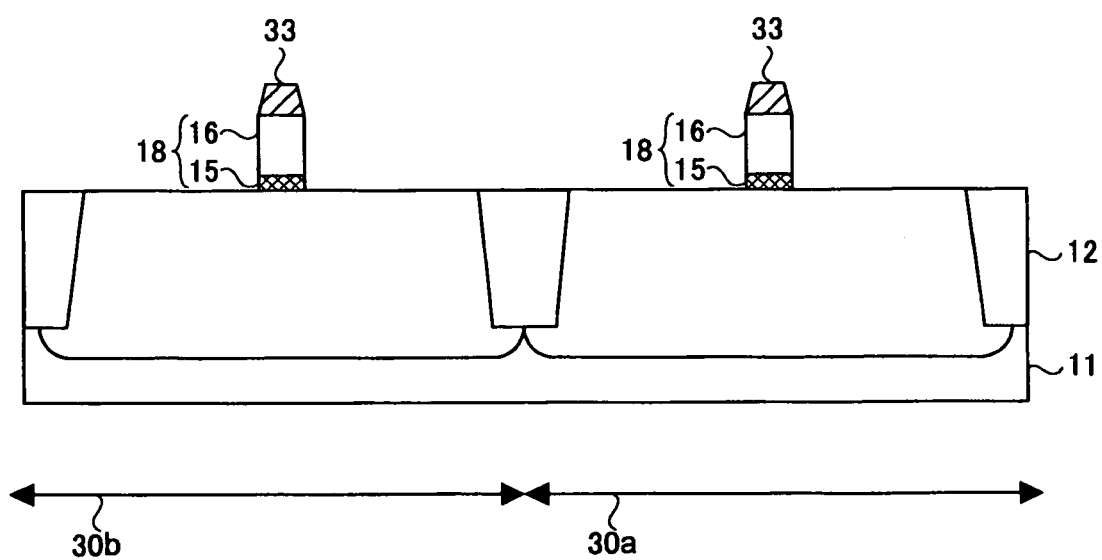
FIG. 5 is a sectional view of the semiconductor device in the step of the semiconductor device fabricating method according to the first embodiment of the present invention (Part 3).

Then, in the step of FIG. 5, a resist film (not illustrated) is formed on the silicon nitride film 33-1 and is patterned by photolithography, left in the regions where the gate layer structures are to be formed. Then, with the patterned resist film as the mask, the silicon nitride film 33-1, the polysilicon film 16-1 and the silicon oxide film 15-1 are etched by RIE (Reactive Io Etching) to respectively form the cap layer 33, the gate electrodes 16 and the gate insulation film 15. The gate length is set at, e.g., 10-90 nm.

Figure 6:
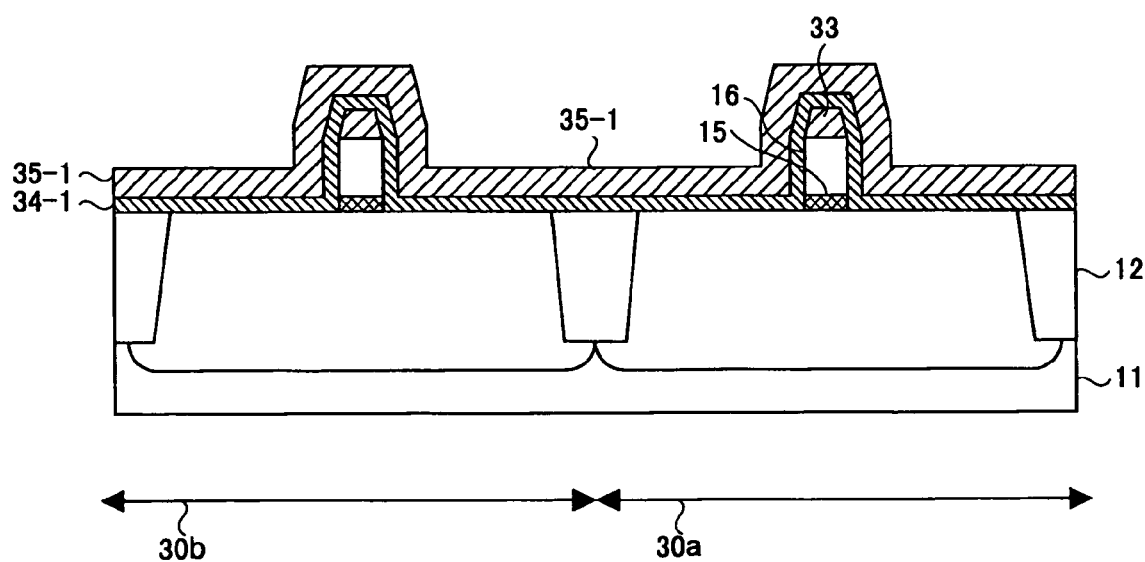
FIG. 6 is a sectional view of the semiconductor device in the step of the semiconductor device fabricating method according to the first embodiment of the present invention (Part 4).

Next, in the step of FIG. 6, a 10 nm-thickness silicon oxide film 34-1 is formed by CVD, covering the structure in FIG. 5. Specifically, the substrate temperature is set at 550-700° C. by CVD using TEOS (tetraethoxy silane) to formed the silicon oxide film 34-1 of a 5-30 nm-thickness.

In the step of FIG. 6, furthermore, a 40 nm-thickness silicon nitride film 35-1 is formed by CVD, covering the silicon oxide film 34-1. Specifically, the silicon nitride film 35-1 of a 10-100 nm-thickness is formed by low pressure CVD using dichlorosilane gas (660 sccm flow rate) and ammonia gas (870 sccm flow rate) at a 20 Pa pressure and a 600-800° C. substrate temperature.

Figure 7:
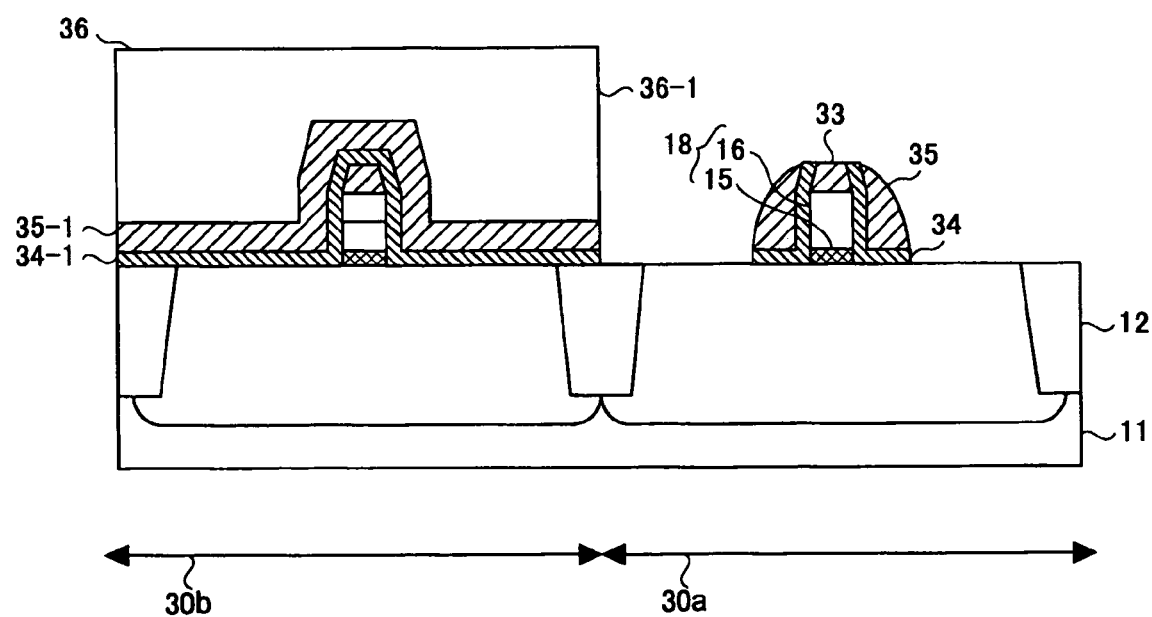
FIG. 7 is a sectional view of the semiconductor device in the step of the semiconductor device fabricating method according to the first embodiment of the present invention (Part 5).

Next, in the step of FIG. 7, a photoresist film 36 is formed, covering the layer in FIG. 6, and an opening 36-1 is formed in the p-MOS region 30*a* of the photoresist film 36 by photolithography.

In the step of FIG. 7, the silicon nitride film 35-1 and the silicon oxide film 34-1 are anisotroptically etched by RIE until the surface of the silicon substrate 11 is exposed to form a first sidewall insulation film 34 of the silicon oxide film covering the both side surfaces of the gate layer structure and a second sidewall insulation film 35 of the silicon nitride film on the outside of the first sidewall insulation film 34. Specifically, the etching gas of the RIE is, e.g., hydrofluorocarbon, such as difluoromethane ($CH_2F_2$), 1,1-diluoroethane ($C_2H_4F_2$) or others, the thickness of the first sidewall insulation film 34 is set at 5-30 nm, and the thickness of the second sidewall insulation film 35 is set at 10-60 nm.

Figure 8:
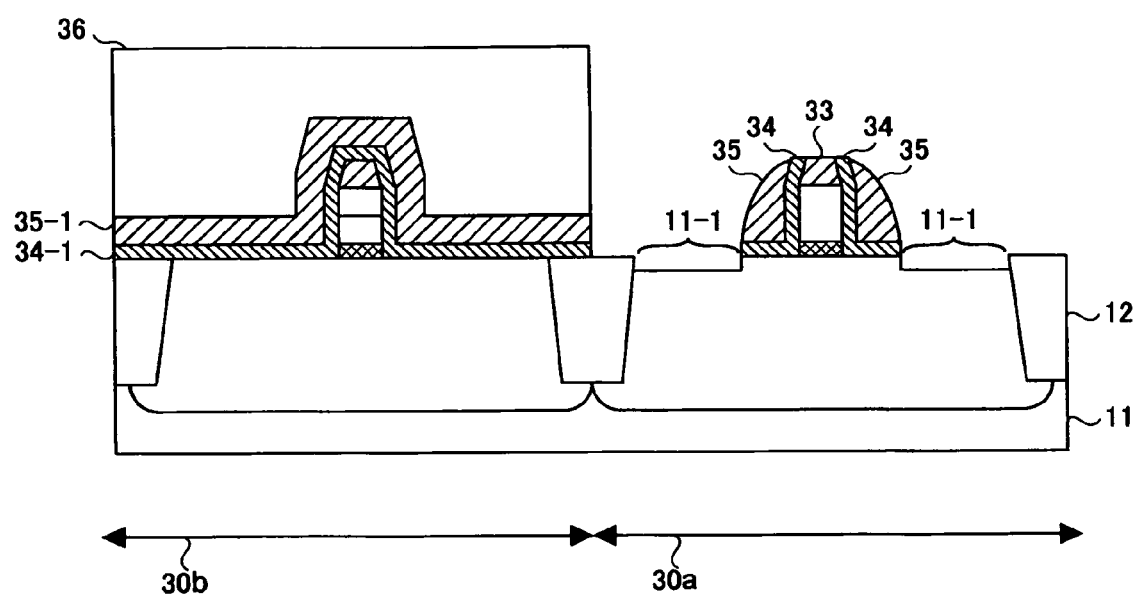
FIG. 8 is a sectional view of the semiconductor device in the step of the semiconductor device fabricating method according to the first embodiment of the present invention (Part 6).

Next, in the step of FIG. 8, with the resist film 36 covering the n-MOS region 30*b*, and the cap layer 33, the first sidewall insulation film 34 and the second sidewall insulation film 35 in the p-MOS region 30*a* as the mask, the surfaces (regions between the second sidewall insulation film 35 and the device isolation regions 12) of the exposed silicon substrate are anisotropically etched by RIE to form trenches 11-1 of, e.g., a 50 nm-depth. Specifically, as the etching gas of the RIE, hydrogen bromide (HBr) or others are used, and the depth of the trenches 1101 is set at 10-150 nm.

In the step of FIG. 8, in the n-MOS region 30*b*, the resist film is removed before the anisotropic etching, and the silicon nitride film 35-1 may be used as the mask. In this case, the thickness of the silicon nitride film 35-1 is preferably set at 10-100 nm.

Figure 9:
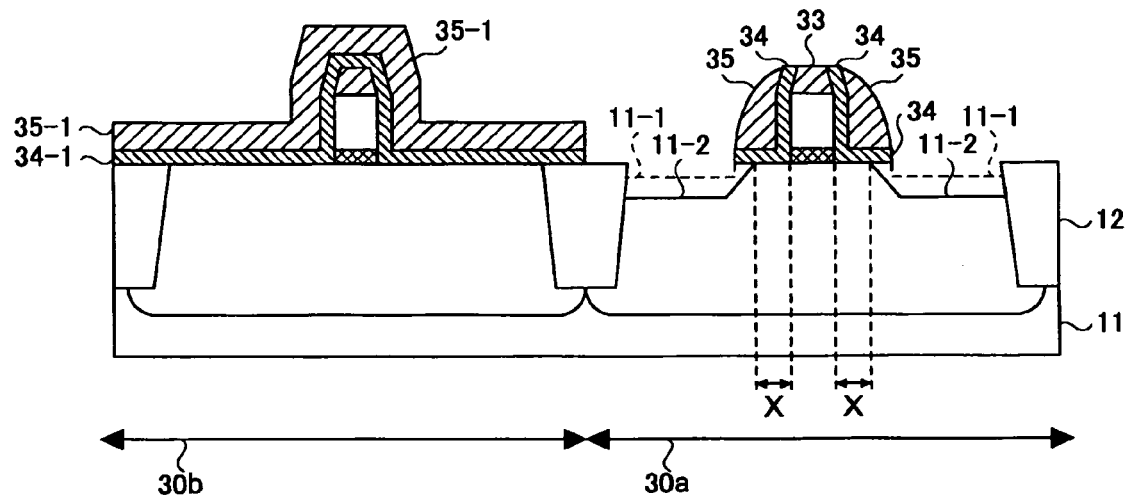
FIG. 9 is a sectional view of the semiconductor device in the step of the semiconductor device fabricating method according to the first embodiment of the present invention (Part 7).

Then, in the step of FIG. 9, the resist film in the n-MOS region 30*b* is removed. Then, after natural oxide film on the surface of the trenches 11-1 is removed with hydrofluoric acid aqueous solution, with the silicon nitride film 35-1 and the silicon oxide film 34-1 in the n-MOS region 30*b*, and the cap layer 33, the first sidewall insulation film 34 and the second sidewall insulation film 35 in the p-MOS region 30*a* as the mask, the trenches 11-1 of the structure in FIG. 8 is polished by chemical dry etching.

By the chemical dry etching, the trenches 11-1 are isotropically etched to polish the silicon substrate 11 even inward of both ends of the second sidewall insulation film 35. Specifically, the chemical dry etching uses hydrochloride (HCl) gas or chlorine ($Cl_2$) gas and is set at a 0.1-10000 Pa pressure and a 600-900° C. substrate temperature. The etching amount is set so that the distance X from the ends of the gate insulation film to the ends of the trenches is 5-80 nm.

The chemical dry etching, in which hydrogen chloride gas or others chemically reacts with the Si to polish the surfaces of the trenches, can depress the impact to the trench surfaces than the plasmas of RIE or others and is superior in the polish isotropy to the latter.

In place of the chemical dry etching, wet etching may be used. Chemical dry etching is preferable in handling, because the formation of the compressive stress applying portions 20 in the next step is performed in the chamber.

Figure 10:
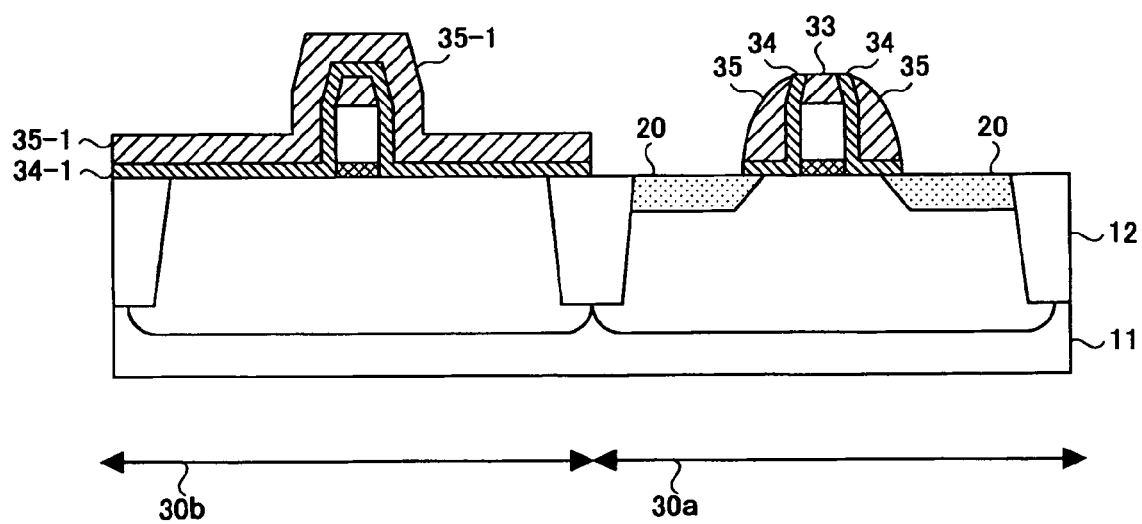
FIG. 10 is a sectional view of the semiconductor device in the step of the semiconductor device fabricating method according to the first embodiment of the present invention (Part 8).

Next, in the step of FIG. 10, a SiGe film to be the compressive stress applying portions 20 is grown by CVD on the surfaces of the trenches 11-1 of the structure in FIG. 9. The SiGe film is epitaxially grown with the (001) face directed height-wise on, e.g., the (001) face of the Si.

The SiGe film, whose lattice constant is larger than that of Si, applies a compressive stress to the compressive stress inducting portion 21 (where the channel is to be formed) from both sides thereof to thereby generate a compressive stress in the compressive stress inducing portion 21.

Specifically, the SiGe film is grown up to the height which agrees with the surface of the silicon substrate 11 by low pressure thermal CVD using as the raw material gases $SiH_2Cl_2$ (flow rate: 50-300 sccm), $GeH_4$ (flow rate: 50-300 sccm), $SiCH_6$ (flow rate: 2-50 sccm), HCL (flow rate: 30-300 sccm) and $H_2$ (flow rate: 100 sccm-100 slm) under a 100-5000 Pa pressure and at a 500-800° C. substrate temperature. This processing the SiGe film is grown selectively only on the surfaces of the trenches with the Si exposed.

The formation of the SiGe film on the surface of the gate electrodes, which is covered by the cap layer 33, can be prevented.

The composition of the SiGe film is set for the epitaxial growth of the surfaces of the trenches with respect to the Si so that the Ge concentration is preferably 1-40 atoms, more preferably 5-40 atoms.

As the Si source gas, in place of $SiH_2Cl_2$ gas, $SiH_4$, $Si_2H_6$, $Si_3H_8$ or $Si_3Cl_6$ gas may be used, or 2 or more of these gases may be used. As the Ge source gas, in place of $GeH_4$ gas, $GeH_2Cl_2$ gas may be used, or these gases may be mixed. HCl gas and $Cl_2$ gas may not be used. HCl gas or $Cl_2$ gas is added to thereby remove the SiGe particles adhering to the surfaces other than the trenches 11-2.

The compressive stress applying portion 20 may be formed in the so-called elevated S/D, in which the compressive stress applying portion 20 is higher than the surface of silicon substrate 11. The compressive stress applying portion 20 may be formed of SiGeC film, and it is preferable that the C (carbon) concentration is higher than 0 atom % and below 2 atoms % including 2 atoms %. The use of the SiGeC film can improve the thermal stability than the SiGe film. When the C concentration exceed 2 atoms %, the crystallinity of the SiGeC film is lowered.

Figure 11:
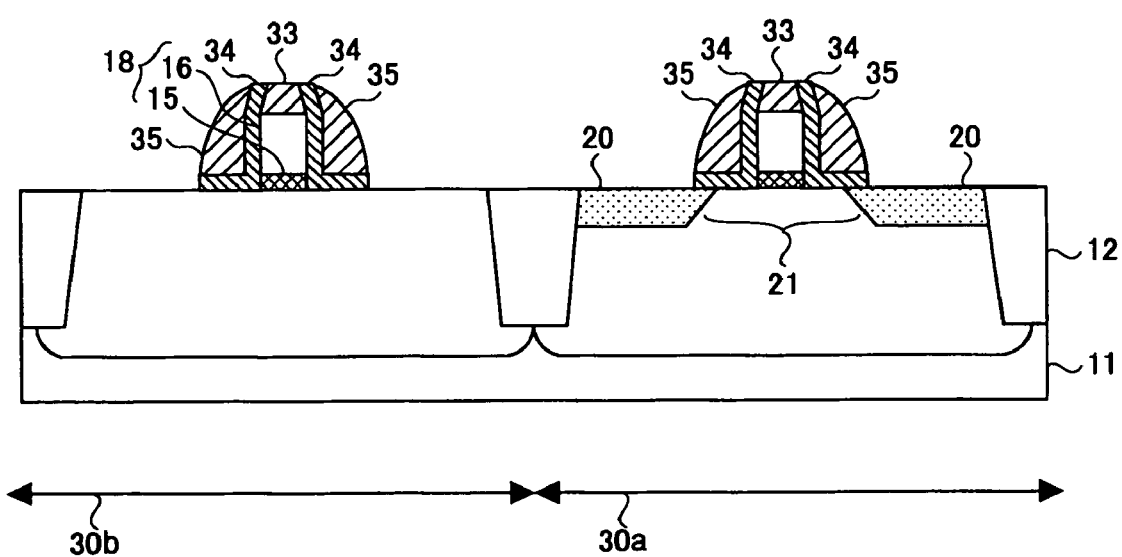
FIG. 11 is a sectional view of the semiconductor device in the step of the semiconductor device fabricating method according to the first embodiment of the present invention (Part 9).

Then, in the step of FIG. 11, a photoresist film (not illustrated) is formed, covering the structure in FIG. 10. An opening is formed in the n-MOS region 30*b* of the photoresist film by photolithography. Then the silicon nitride film 3501 and the silicon oxide film 34-1 are anisotropically etched by RIE until the surface of the silicon substrate 11 is exposed to thereby form the first sidewall insulation film 34 of the silicon oxide film covering both side surfaces of the gate layer structure 18 and the second sidewall insulation film 35 of the silicon nitride film on the outside of the first sidewall insulation film 34. Specifically, the RIE is performed in the same way as in the step of FIG. 7. Next, the resist film is removed.

Figure 12:
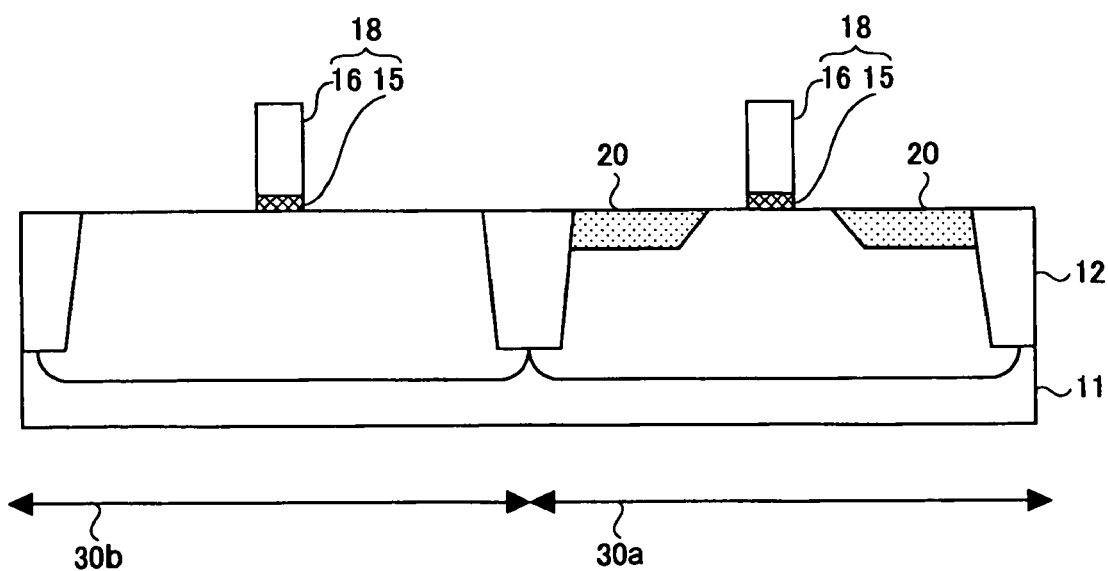
FIG. 12 is a sectional view of the semiconductor device in the step of the semiconductor device fabricating method according to the first embodiment of the present invention (Part 10).

Then, in the step of FIG. 12, the cap layer 33, the second sidewall insulation film 35 and the first sidewall insulation film 34 of the structure in FIG. 11 are removed by wet etching to thereby leave the gate layer structure on the surface of the silicon substrate 11. Specifically, the cap layer 33 and the second sidewall insulation film 35 of silicon nitride film are removed with, e.g., phosphate aqueous solution, and the first sidewall insulation film 34 of silicon oxide film is removed with, e.g., a hydrofluoric acid aqueous solution.

Figure 13:
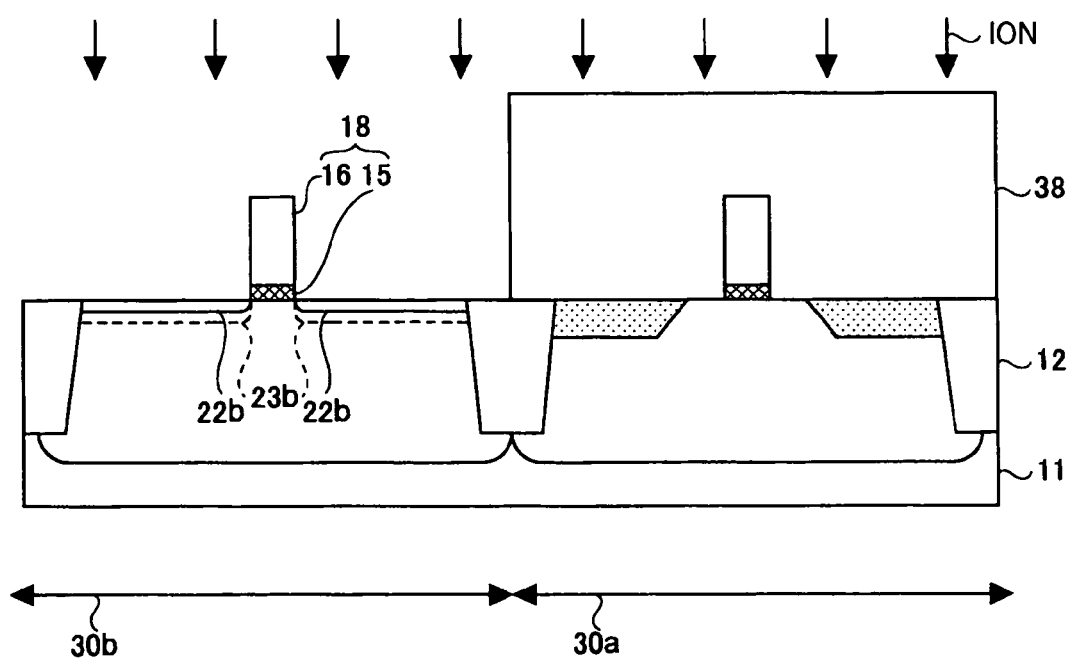
FIG. 13 is a sectional view of the semiconductor device in the step of the semiconductor device fabricating method according to the first embodiment of the present invention (Part 11).

Then, in the step of FIG. 13, a photoreisst film (not illustrated) is formed, covering the structure in FIG. 12, and the n-MOS region 30b of the resist film is opened by photolithography. Then, with the gate layer structure with the mask, a p-impurity is implanted in the silicon substrate 11 on both sides of the gate layer structure to thereby form a pocket region 23b. Specifically, the p-impurity is, e.g., In, the acceleration energy is 50 keV, and the dose is $5\times10^{13}$ cm$^{-2}$.

In the step of FIG. 13, furthermore, in the n-MOS region 30b, with the gate layer structure as the mask, an n-impurity is implanted by ion implantation in the silicon substrate 11 on both sides of the gate layer structure 18 to thereby form shallow junction regions 22b. Specifically, the n-impurity is, e.g., As$^+$, the acceleration energy is 5 keV, and the dose is $1\times10^{15}$ cm$^{-2}$. The pocket regions 22b may be formed or may not be formed.

Figure 14:
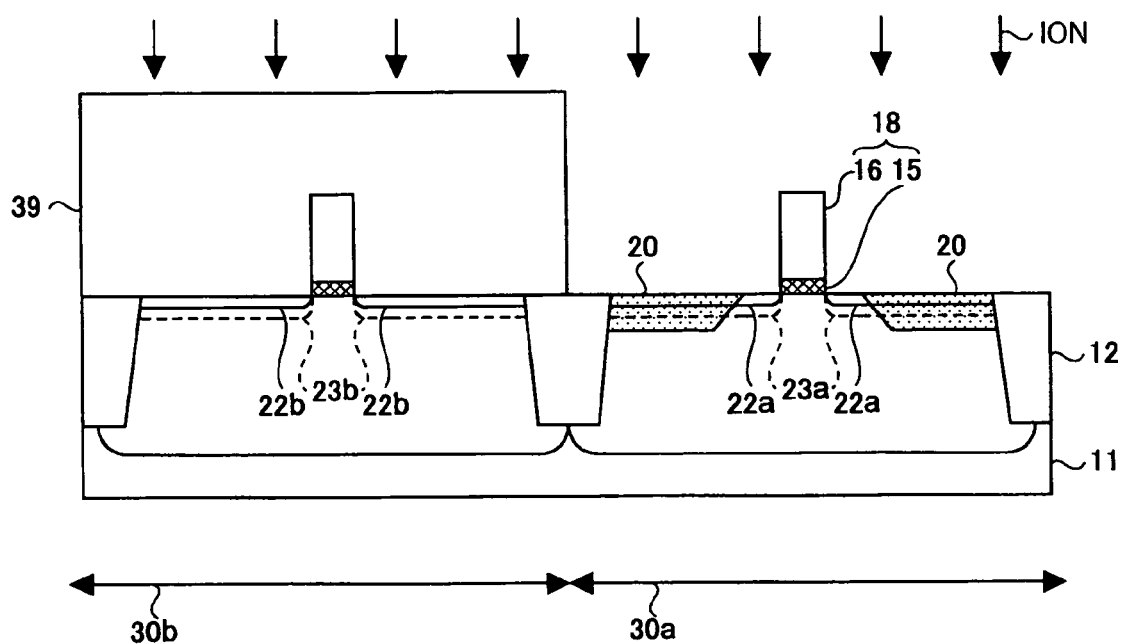
FIG. 14 is a sectional view of the semiconductor device in the step of the semiconductor device fabricating method according to the first embodiment of the present invention (Part 12).

Next, in the step of FIG. 14, the resist film 38 on the structure in FIG. 13 is removed, and in the same way as in the step of FIG. 13, a resist film 39 opened in the p-MOS region 30a is formed. Next, in the p-MOS region 30a, with the gate layer structure 18 as the mask, an n-impurity is implanted by ion implantation slantly in the silicon substrate 11 on both sides of the gate layer structure to thereby form a pocket region 23a. Specifically, the n-impurity is, e.g., Sb$^+$, the acceleration energy is 60 keV, and the dose is $5\times10^{13}$ cm$^{-2}$.

In the step of FIG. 14, furthermore, in the p-MOS region 30a, with the gate layer structure 18 as the mask, a p-impurity is implanted by ion implantation into the silicon substrate 11 on both sides of the gate layer structure 18 to thereby form shallow junction regions 22a. Specifically, the n-impurity is, e.g., B$^+$, the acceleration energy is 5 keV, and the dose is $1\times10^{15}$ cm$^{-2}$.

Figure 15:
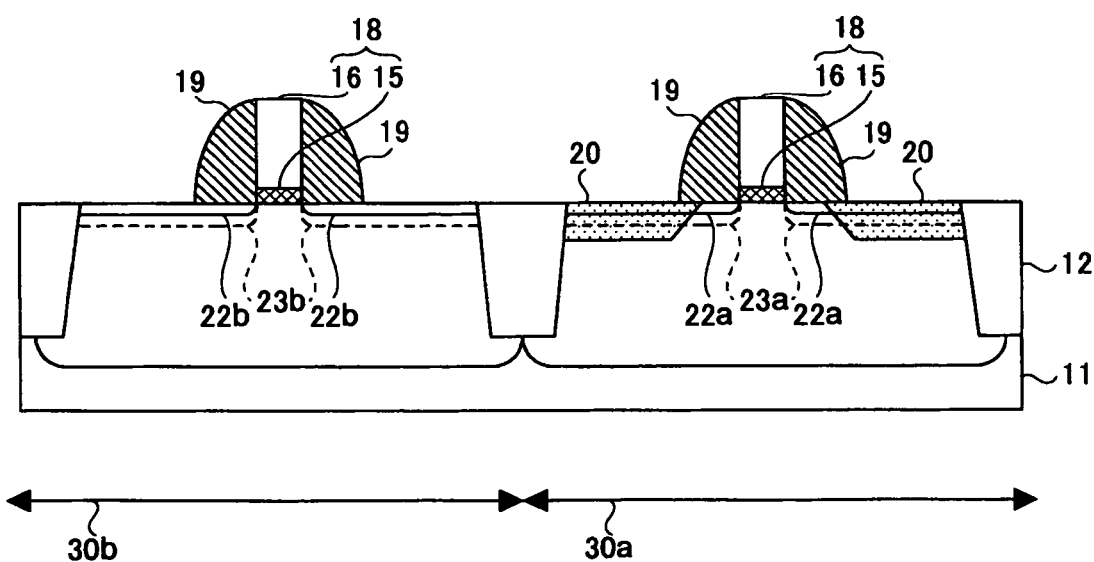
FIG. 15 is a sectional view of the semiconductor device in the step of the semiconductor device fabricating method according to the first embodiment of the present invention (Part 13).

Next, in the step of FIG. 15, the resist film 39 in FIG. 14 is removed, and a 80 nm-thickness silicon oxide film (not illustrated) is formed on the surface of the structure by CVD. Specifically, the silicon oxide film is formed by, e.g., thermal CVD using, as the raw material gas, BTBAS (Bis(Tertiary-butylamino)Silane, $C_8H_{22}N_2Si$) gas and $O_2$ gas under a 0.1-1000 Pa pressure at a 500-580° C. substrate temperature.

In the step of FIG. 15, the silicon oxide film is etched (etched back) by RIE until the surface of the silicon substrate 11 is exposed to thereby for a third sidewall insulation film 10 covering both side surfaces of the gate layer structures 18 in the p-MOS region 30a and the n-MOS region 30b. Specifically, the etching gas for the RIE is, e.g., hydrofluorocarbon, such as difluoromethane (CH$_4$F$_2$), 1,1-difluoroethane (C$_2$H$_4$F$_2$) or others.

Figure 16:
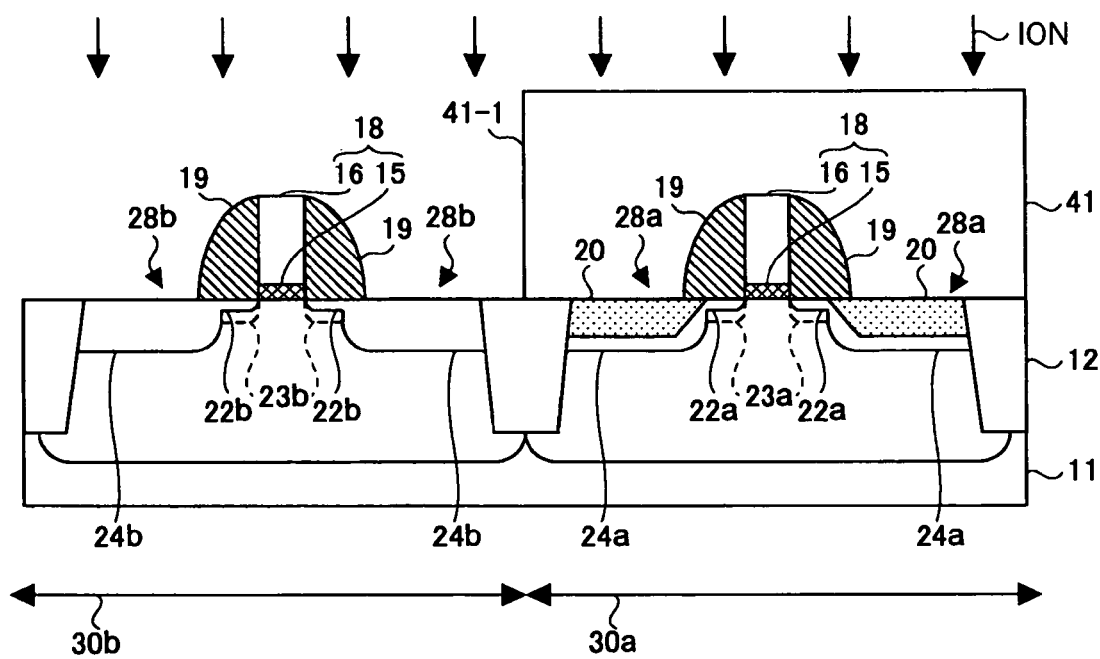
FIG. 16 is a sectional view of the semiconductor device in the step of the semiconductor device fabricating method according to the first embodiment of the present invention (Part 14).

Next, in the step of FIG. 16, a resist film (not illustrated) is formed, covering the structure in FIG. 15, and an opening is formed in the resist film in the p-MOS region 30a by photolithography. In the p-MOS region 30a, with the gate layer structure 18 and the third sidewall insulation film 19 as the mask, a p-impurity is implanted by ion implantation in the silicon substrate 11 on both sides of the third sidewall insulation film 19 to thereby form deep junction regions 24a as the source/drain regions 28a down to a deeper position than the bottom of the compressive stress applying portions 20 of the SiGe film. Specifically, the p-impurity is, e.g., B$^+$, the acceleration energy is 8 keV, and the dose is $5\times10^{15}$ cm$^{-2}$. Then, the resist film is removed.

In the step of FIG. 16, furthermore, substantially in the same way as I the p-MOS region 30a, a resist film 41 is formed, and an opening 31-1 is formed in the resist film in the n-MOS region 30b by photolithography. With the gate layer structure 18 and the third sidewall insulation film as the mask, an n-impurity is implanted in the silicon substrate 11 on both sides of the third sidewall insulation film 19 to thereby form deep junction regions 24b as source/drain regions 28b. Specifically, the n-impurity is, e.g., As$^+$, the acceleration energy is 6 keV, and the dose is $1\times10^{16}$ cm$^{-2}$.

Figure 17:
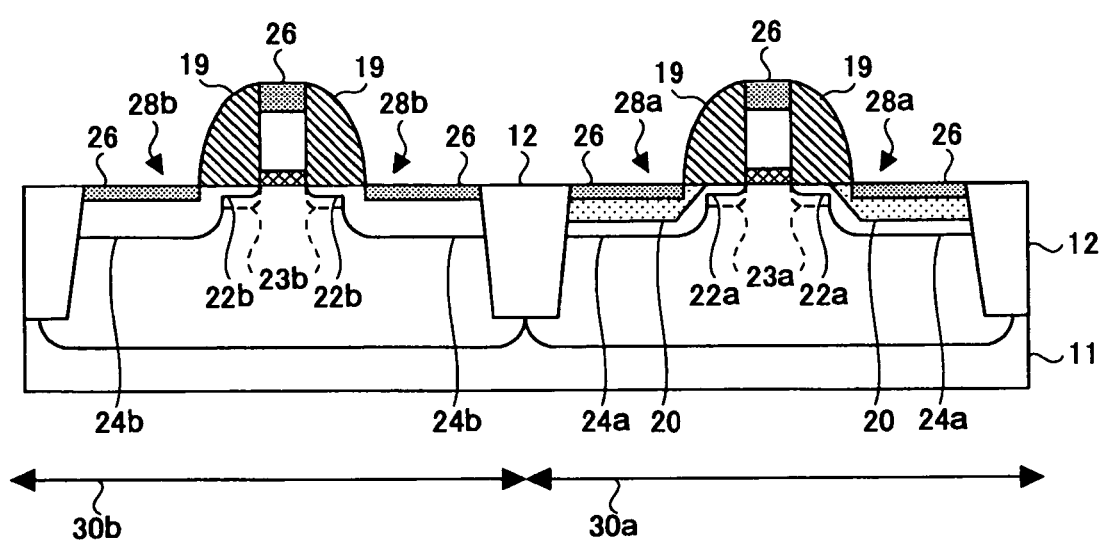
FIG. 17 is a sectional view of the semiconductor device in the step of the semiconductor device fabricating method according to the first embodiment of the present invention (Part 15).

Next, in the step of FIG. 17, the resist film of the structure 41 in the step of FIG. 16 is removed. Then, thermal processing is performed by RTA (Rapid Thermal Annealing) to thereby activate the impurities in the shallow junction regions 22a, 22b, the deep junction regions 24a, 24b and the pocket regions 23a, 23b.

In the step of FIG. 17, an Ni film, Ti film or Co film of, e.g., a 5 nm-thickness is formed, covering the surface of the structure and is silicided by thermal processing to thereby form a silicide film 26, such as NiSi$_2$ film, TiSi$_2$ film, CoSi$_2$ film or others, on the surface of the silicon substrate 11 in the source/drain regions 28a, 28b and the surfaces of the gate electrodes 16. Then, the Ni film, Ti film or Co film which has not been silicided is removed. Although the following steps will be neither illustrated nor detailed, the structure in FIG. 17 is covered by an inter-layer insulation film, contacts are formed through the inter-layer insulation film and contacting the source/drain regions 28a, 28b, an interconnection layer is formed on the inter-layer insulation film and is electrically connected to the contacts, and furthermore, inter-layer insulation films and interconnection layers, vertical interconnections, etc. are formed, and the semiconductor device is completed.

In the fabrication method according to the present embodiment, the impurity implantation for forming the shallow junction regions 22a, 22b and the deep junction regions 23a, 23b is performed after the compressive stress applying portions 20 of SiGe film have been formed, whereby the impurity, especially the impurity of the shallow junction regions 22a, 22b is prevented from being diffused immediately below the gate insulation film 15. Accordingly, the short channel effect can be prevented, the hole mobility of the compressive stress inducing portion 21 (channel region) of the p-MOS transistor 13a is increased, and the operation speed of the p-MOS transistor 13a is increased, whereby the p-MOS transistor is balanced with the n-MOS transistor in the operation speed, and resultantly the total operation speed of the complementary semiconductor device 10 can be increased. The drain current of the p-MOS transistor 13a can be increased, whereby the p-MOS transistor 13a can be balanced with the n-MOS transistor also in the rain current.

In the fabrication method according to the present embodiment, the compressive stress applying portions 20 of SiGe film are formed in the source/drain regions 28a and are spaced from the ends of the gate layer structure 18, whereby the Ge atoms are prevented from being diffused into the interface with the gate insulation film 15 by thermal processing after the SiGe film has been formed, and the hole mobility decrease due to the interface level increase can be suppressed.

In the fabrication method according to the present embodiment, the gate electrodes 33 are protected by the cap layer 33 in forming the trench in the p-MOS region 30a in the steps of FIGS. 7 and 8, the surfaces of the gate electrodes 33 are prevented from being etched, and the gate electrodes of the n-MOS region 30a and the p-MOS region 30b can be made uniform in the thickness. Resultantly, the width-wise thickness of the third sidewall insulation film 19 can be made substantially uniform between the p-MOS region 30a and the n-MOS region 30b, which facilitates making uniform the distances between the 2 deep junction regions 24a; 24b of the respective regions. As a result, the parasitic capacitances can be made uniform.

A Second Embodiment

The semiconductor device fabricating method according to a second embodiment of the present embodiment will be explained with reference to FIGS. 18 to 22. FIGS. 18 to 22 are sectional views of the semiconductor device in the steps of the semiconductor device fabricating method according to the second embodiment of the present invention, which illustrate the method. The parts of the semiconductor device corresponding to the parts explained above are indicated by the same reference numbers not to repeat their explanation.

The second embodiment of the present invention is characterized in that in etching the trenches for the compressive stress applying portions to be formed in, a mask which is different for that of the first embodiment is used.

Figure 18:
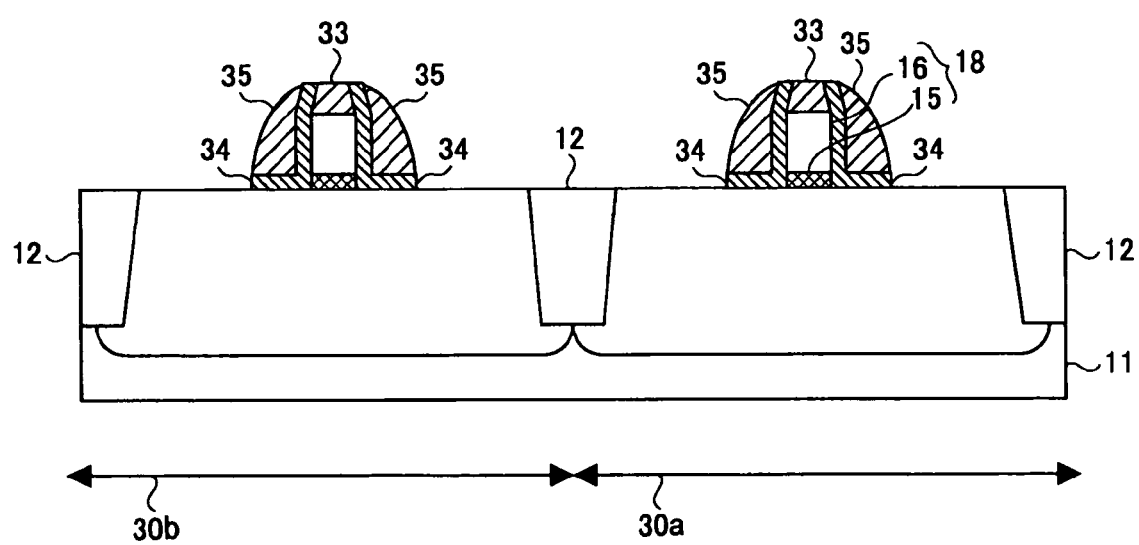
FIG. 18 is a sectional view of the semiconductor device in the step of the semiconductor device fabricating method according to a second embodiment of the present invention (Part 1).

First, in the step of FIG. 18, the same steps of FIGS. 3 to 6 of the first embodiment are performed to form the structure with a silicon oxide film 34-1 and a silicon nitride film 35-1 deposited, covering the surface of a silicon substrate 11, gate layer structures 18 and a cap layer 33.

In the step of FIG. 18, furthermore, in both a p-MOS region 30a and an n-MOS region 30b, the silicon nitride film 35-1 and the silicon oxide film 34-1 are concurrently etched anisotropically by RIE until the surfaces of the silicon substrate 11 is exposed to thereby form a first sidewall insulation film 34 of the silicon oxide film covering both side surfaces of the gate layer structures 18 and a second sidewall insulation film 35 of the silicon nitride film covering the outside of the first sidewall insulation film 34. Specifically, the etching gas for the RIE is, e.g., hydrofluorocarbon, such as difluoromethane ($CH_2F_2$), 1,1-difluoroethane ($C_2H_4F_2$) or others.

Figure 19:
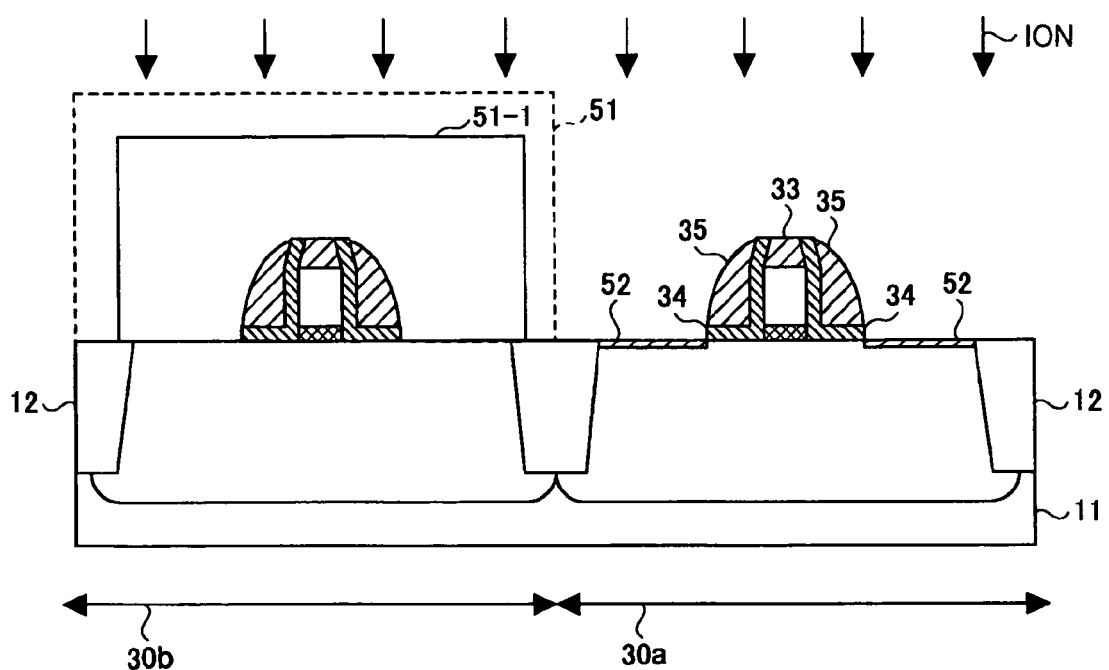
FIG. 19 is a sectional view of the semiconductor device in the step of the semiconductor device fabricating method according to the second embodiment of the present invention (Part 2).

Then, in the step of FIG. 19, a resist film 52 (of, e.g., 500 nm-thickness) is formed, covering the structure in FIG. 19, and an opening is formed in the resist film 51 in the p-MOS region 30a by photolithography.

In the step of FIG. 19, furthermore, the surface of the silicon substrate 11 in the p-MOS region 30a is subjected to surface processing (hereinafter called "the first surface processing") using an ashing system and $CF_4$ gas and $O_2$ gas as the process gas. The first surface processing is performed not to expose the surface of the silicon substrate 11 in the n-MOS region 30b. The first surface processing deforms the surface of the silicon substrate 11 in the p-MOS region 30a, which is to be source/drain regions.

The first surface processing is performed specifically with a diode parallel plate plasma ashing system under a 100-1000 Pa internal chamber pressure, at a 4-50 sccm $CF_4$ flow rate and a 500-1000 sccm $O_2$ gas flow rate, at a 300-3000 W RF electric power and for 20 seconds. In place of $CF_4$ gas, $CH_2F_2$, $C_2H_4F_2$ or others may be used. The surface of the resist film 51 is etched by the surface processing, and the resist film is thinned to be a resist film 51-1.

Figure 20:
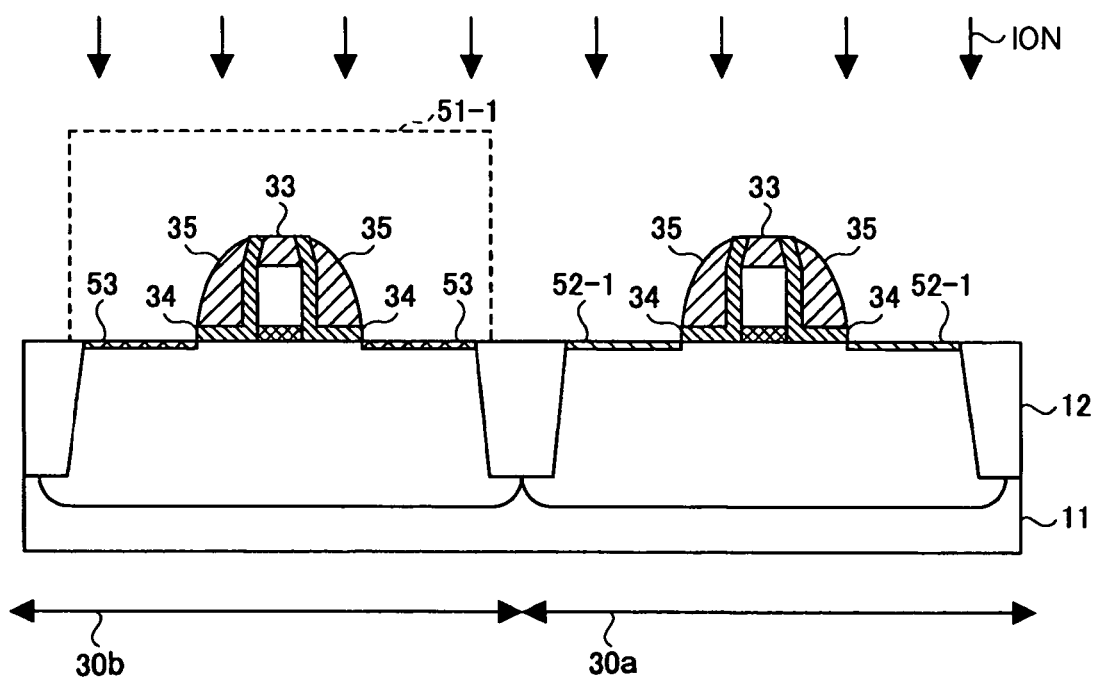
FIG. 20 is a sectional view of the semiconductor device in the step of the semiconductor device fabricating method according to the second embodiment of the present invention (Part 3).

Next, in the step of FIG. 20, with an ashing system, the resist film 51-1 is removed by using $O_2$ gas as the process gas, and the surface of the silicon substrate 11 in the p-MOS region 30a and the p-MOS region 30b is surface-processed (hereinafter called "a second surface processing"). The second surface processing further deforms the surfaces of the silicon substrate 11 in the p-MOS region 30a, which are to be the source/drain regions, and an ashing deformed film 52-1 is formed. The second surface processing also oxidizes the surface of the silicon substrate 11 in the n-MOS region 30b, and a silicon oxide film 53 is formed. The studies of the inventors of the present application have found that the ashing deformed film 52 is inferior to the silicon oxide film 53 in hydrofluoric acid resistance and can be relatively easily removed by hydrofluoric acid aqueous solution.

The second surface processing is performed specifically with the same ashing system as in the step of FIG. 19, under a 100-1000 Pa internal chamber pressure, at a 500-1000 $O_2$ gas flow rate, at a 300-3000 W RF electric power and for 20 seconds.

Figure 21:
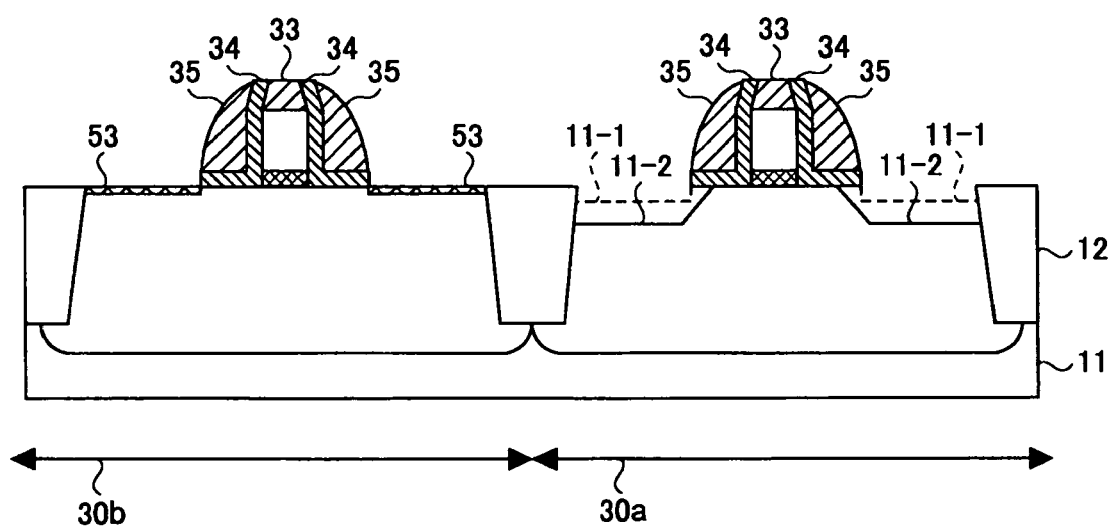
FIG. 21 is a sectional view of the semiconductor device in the step of the semiconductor device fabricating method according to the second embodiment of the present invention (Part 4).

Next, in the step of FIG. 21, with hydrofluoric acid aqueous solution, the ashing deformed film alone in the p-MOS region 30a is removed to expose the surface of the silicon substrate 11 in the p-MOS region 30a. At this time, the silicon oxide film in the n-MOS region 30b, which is superior to the ashing deformed film in hydrofluoric acid resistance, remains.

In the step of FIG. 21, furthermore, with the cap layer 33, the first sidewall insulation film 34 and the second sidewall insulation film 35 in the n-MOS region 30b and the p-MOS region 30a, and the silicon oxide film 53 in the n-MOS region 30b as the mask, in the same way as in the step of FIG. 8 of the first embodiments the surface of the silicon substrate 11 in the p-MOS region 30a (the region between the second sidewall insulation film 35 and the device isolation region 21) is anisotropically etched by RIE to thereby form trenches 11-1 of, e.g., a 50 nm-depth.

In the step of FIG. 21, furthermore, in the same way as in the step of the first embodiment, the trenches are isotropically etched by chemical dry etching. The trenches 11-1 are polished up to the regions inward of both ends of the second sidewall insulation film 35.

Figure 22:
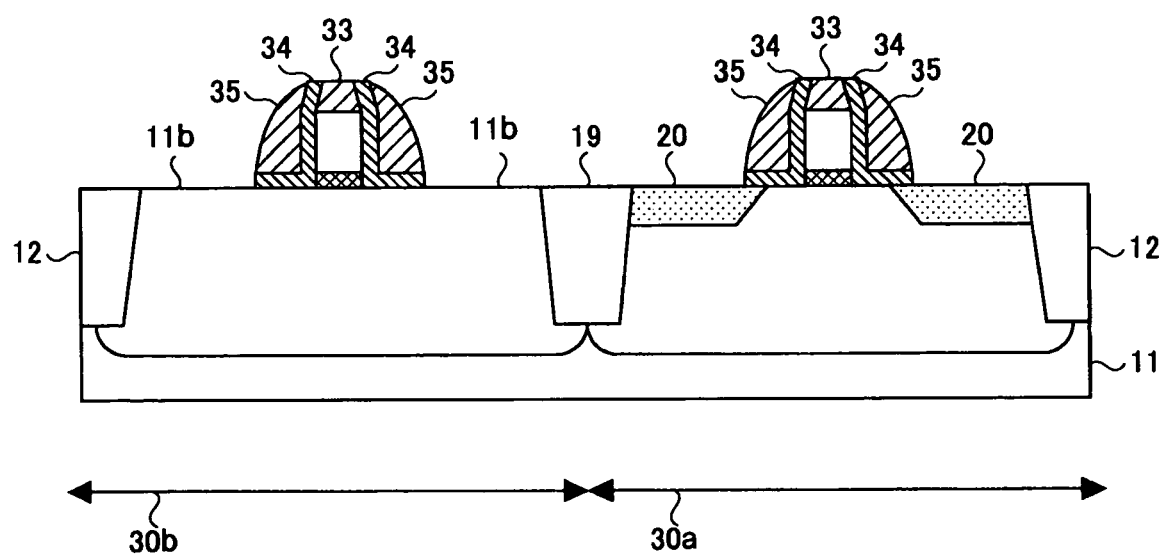
FIG. 22 is a sectional view of the semiconductor device in the step of the semiconductor device fabricating method according to the second embodiment of the present invention (Part 5).

Next, in the step of FIG. 22, in he same way as in the step of FIG. 10 of the first embodiment, SiGe film to be the compressive stress applying portions 20 is crystal grown on the surfaces of the trenches of the structure in FIG. 21.

In the step of FIG. 22, a resist film (not illustrated) is formed, covering the structure, and the resist film in the n-MOS region 30b is opened by photolithography. The silicon oxide film 52 is anisotropcially etched by RIE until the surface of the silicon substrate 11 is exposed. The anisotropic etching is performed in the same way as in the step of FIG. 7. Then, the resist film is removed.

Figure 1:
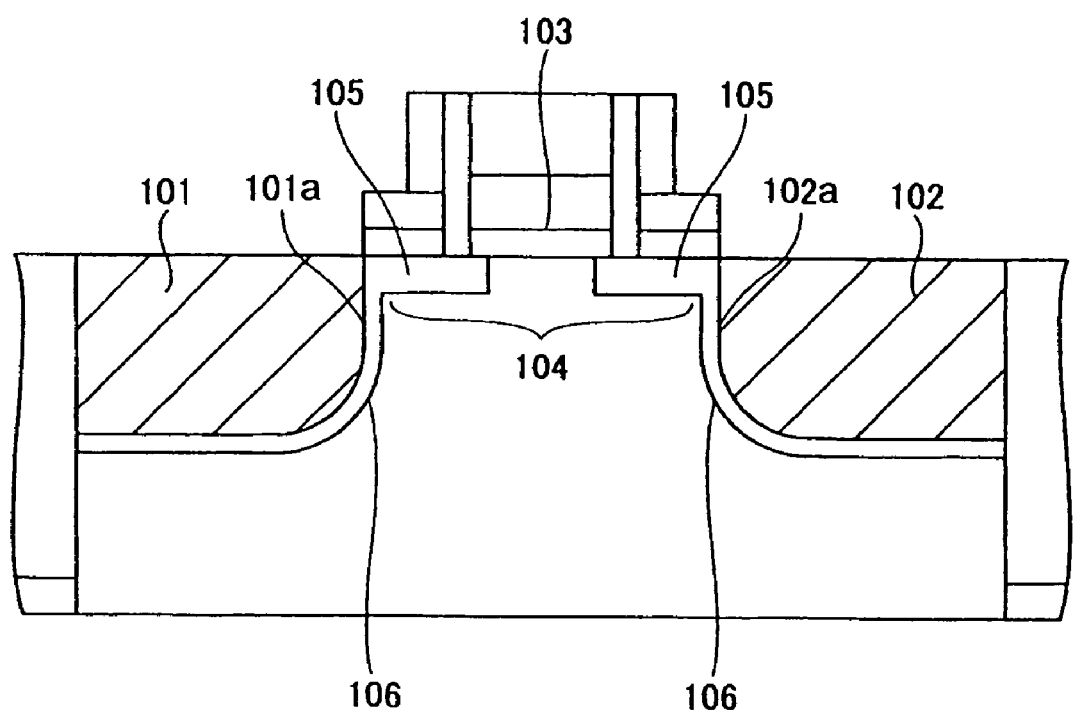
FIG. 1 is a sectional view of the conventional p-MOS transistor.

The following steps are performed in the same way as the steps of FIGS. 12 to 17 of the first embodiment, and the semiconductor device illustrated in FIG. 1 is completed.

In the semiconductor device fabricating method according to the present embodiment, by the first surface processing and the second surface processing, the silicon oxide film 52 is formed on the surface of the silicon substrate 11 in the n-MOS region 30b while the ashing deformed film 52-1 which is inferior to the silicon oxide film 53 in hydrofluoric acid resistance is formed on the surface of the p-MOS region 30a. That is, films which are different from each other in etching selectivity to hydrofluoric acid aqueous solution are formed on the surface of the silicon substrate 11 in the p-MOS region 30a and the n-MOS region 30b. Accordingly, the silicon substrate surface only in the p-MOS region 30a can be exposed by hydrofluoric acid processing, which facilitates forming the trenches 11-1, 11-2.

In the semiconductor device fabricating method according to the present embodiment, the anisotropic etching of the silicon oxide film 34-1 and the silicon nitride film 35-1 is performed concurrently in the p-MOSA region 30a and the n-MOS region 30b, whereby the number of the steps can be smaller than that of the fabrication method according to the first embodiment, in which the anisotropic etching is performed respectively in the p-MOS region 30a and the n-MOS region 30n, the first sidewall insulation film 34 and the second sidewall insulation film 35 in the p-MOS region 30a and the n-MOS region 30b can be formed substantially in the same dimensions, which facilitates setting conditions for removing the first sidewall insulation film 34 and the second sidewall insulation film 35 and can suppress the disuniform removal. It is needless to say that the fabrication method according to the present embodiment can produce the same effects as the fabrication method according to the first embodiment.

A Third Embodiment

The semiconductor device fabricating method according to a third embodiment of the present invention will be explained with reference to FIGS. 23 to 29. FIGS. 23 to 29 are sectional view of a semiconductor device in the steps of the semiconductor fabricating method according to the third embodiment, which illustrate the method. The same part as the parts described above are represented by the same reference numbers not to repeat their explanation.

The third embodiment of the present invention is different from the first embodiment I that the shallow junction regions are double-stepped.

The semiconductor device fabricating method according to the third embodiment is the same as the first embodiment in the steps of FIGS. 2 to 14. That is, in the step of FIG. 13, in an n-MOS region 30b, an n-impurity is implanted in a silicon substrate 11 on both sides of a gate layer structure 18 by ion implantation with the gate layer structure as the mask to form shallow junction regions 22b. In the step of FIG. 14, in a p-MOS region 30a, with a gate layer structure 18 as the mask, a p-impurity is implanted in the silicon substrate 11 on both sides of the gate layer structure 18 by ion implantation to form shallow junction regions 22a. Pocket regions 23b may be formed or may not be formed.

Figure 23:
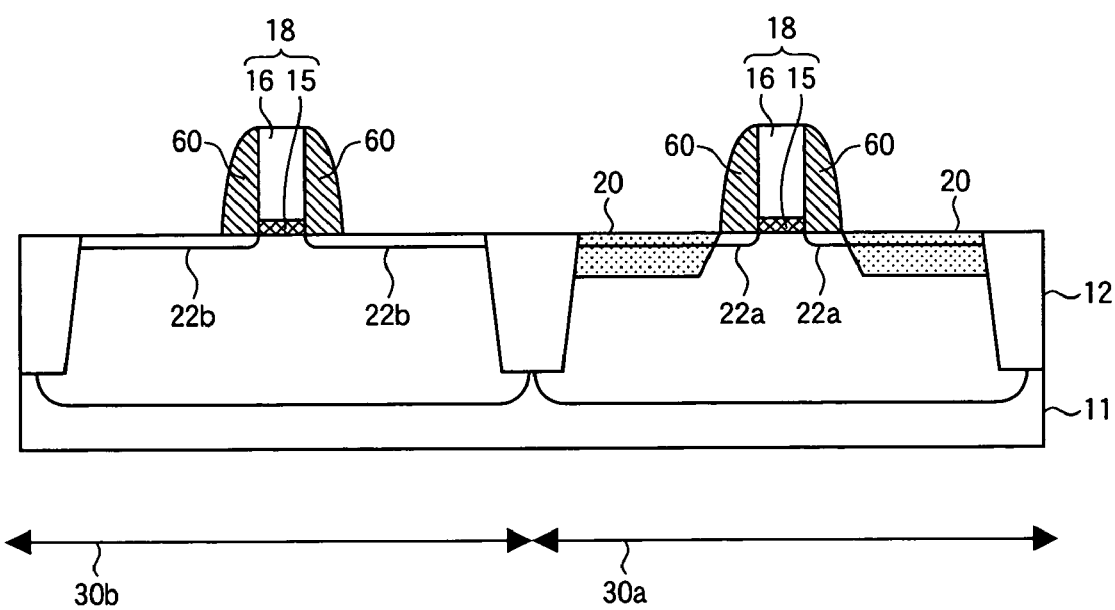
FIG. 23 is a sectional view of a semiconductor device in the step of the semiconductor device fabricating method according to a third embodiment of the present invention (Part 1).

Next, in the step of FIG. 23, the resist film 39 in FIG. 14 is removed, and a 5-50 nm-thickness silicon oxide film (not illustrated) is formed on the surface of the structure by CVD. Specifically, the silicon oxide film is formed, e.g., by thermal CVD using as the raw material gas BTBAS (Bis(Tertiary-butylamino)Silane $C_8H_{22}N_2Si$) gas and $O_2$ gas, under a 0.1-1000 Pa and at a 500-580° C. substrate temperature.

In the step of FIG. 23, furthermore, the silicon oxide film is etched (etched back) by RIE until the surface of the silicon substrate 11 is exposed to thereby form a fourth thin sidewall insulation film 60 covering the both side surfaces of the gate layer structures 18 in the p-MOS region 30a and the n-MOS region 30b. Specifically, the etching gas of the RIE is, e.g., hydrofluorocarbon, such as difluoromethane ($CH_2F_2$), 1,1-difluoroethane ($C_2H_4F_2$) or others.

Figure 24:
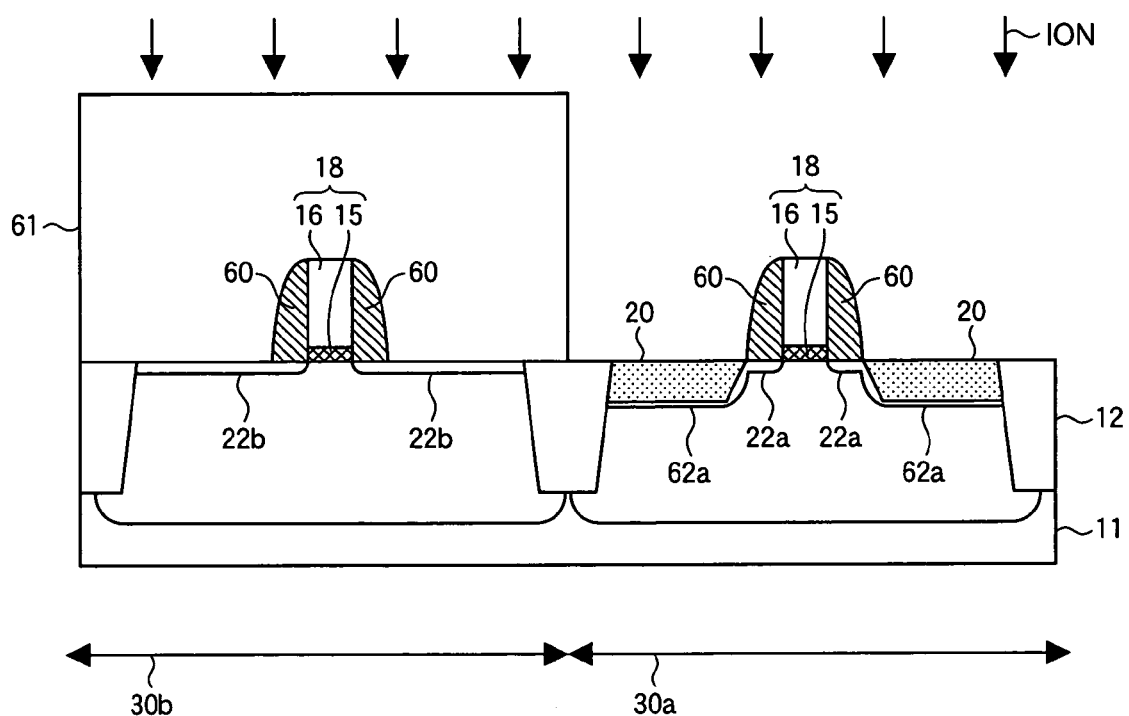
FIG. 24 is a sectional view of a semiconductor device in the step of the semiconductor device fabricating method according to the third embodiment of the present invention (Part 2).

Next, in the step of FIG. 24, a resist film 61 is formed, covering the structure in FIG. 23, and the resist film 62 in the p-MOS region 30a is opened by photolithography. In the p-MOS region 30a, with the gate layer structure 18 and the fourth sidewall insulation film 60 as the mask, a p-impurity is implanted in the silicon substrate 11 on both sides of the fourth sidewall insulation film 60 by ion implantation to thereby form somewhat deeper junction regions 62a which are formed of SiGe film down to a position which is deeper than the bottom of the compressive stress applying portions 20. Specifically, the p-impurity is, e.g., $B^+$, the acceleration energy is 6 keV, and the dose is $2\times10^{15}$ $cm^{-2}$. Then, the resist film 61 is removed.

Figure 25:
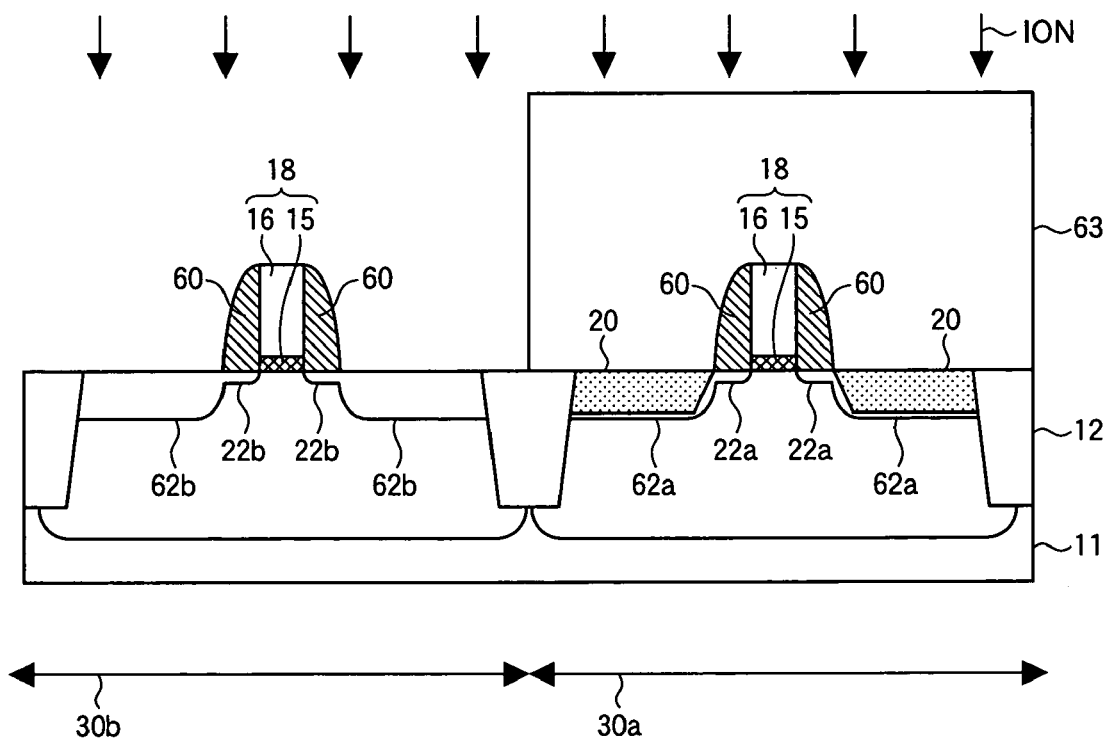
FIG. 25 is a sectional view of a semiconductor device in the step of the semiconductor device fabricating method according to the third embodiment of the present invention (Part 3).

Next, in the step of FIG. 25, in the same was as in the p-MOS region 30a, a resist film 63 is formed, and the resist film 63 in the region n-MOS region 30b is opened by photolithography. With the gate layer structure 18 and the fourth sidewall insulation film 60 as the mask, an n-impurity is implanted in the silicon substrate 11 on both sides of the fourth sidewall insulation film 60 by ion implantation to thereby form somewhat deeper junction regions 24b. Specifically, the n-impurity is, e.g., As+ or P+, the acceleration energy is 7 keV, and the dose is $2\times10^{15}$ $cm^{-2}$. Then, the photoresist film 63 is removed.

Figure 26:
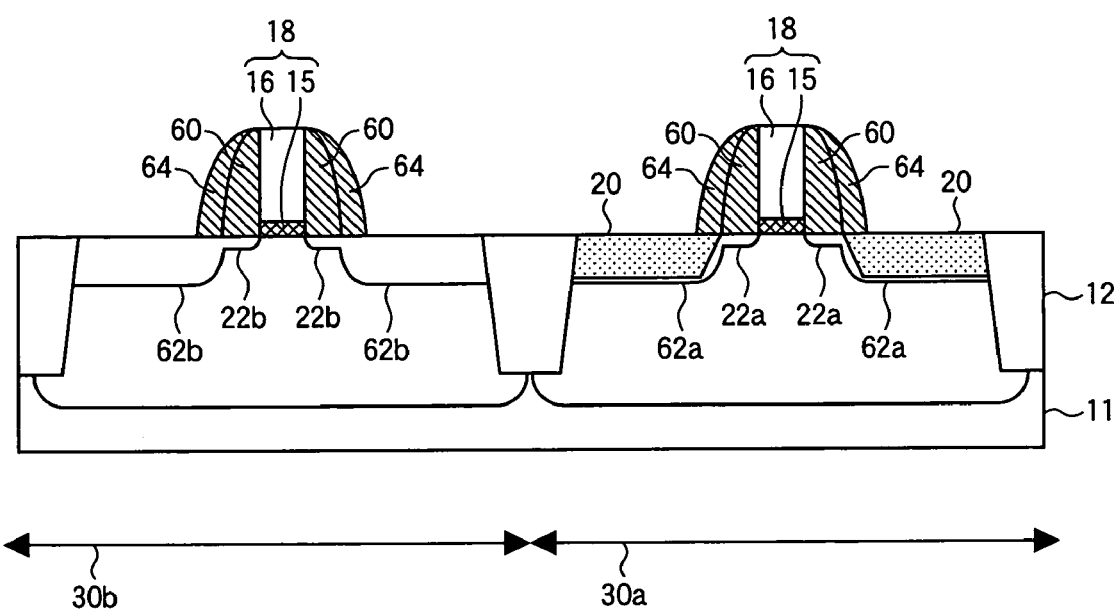
FIG. 26 is a sectional view of a semiconductor device in the step of the semiconductor device fabricating method according to the third embodiment of the present invention (Part 4).

Next, in the step of FIG. 26, a 30-100 nm-thickness silicon oxide film (not illustrated) is formed on the surface of the structure by CVD. Specifically, the silicon oxide film is formed by, e.g., thermal CVD using BTBAS (Bis(Tertiary-butylamino)Silane $C_8H_{22}N_2Si$) gas and $O_2$ gas as the raw material gas, under a 0.1-1000 Pa pressure and a 500-580° C. substrate temperature.

Next, in the step of FIG. 26, the silicon oxide film is etched (etched back) by RIE until the surface of the silicon substrate 11 is exposed to thereby form a fifth sidewall insulation film 64 further covering the both side surfaces of the thin fourth sidewall insulation film 60 covering the both side surfaces of the gate layer structures 18 in the p-MOS region 30a and the n-MOS region 30b. Specifically, the etching gas of the RIE is hydrofluorocarbon, such as difluoromethane ($CH_2F_2$), 1,1-difluoroethane ($C_2H_4F_2$) or others.

Figure 27:
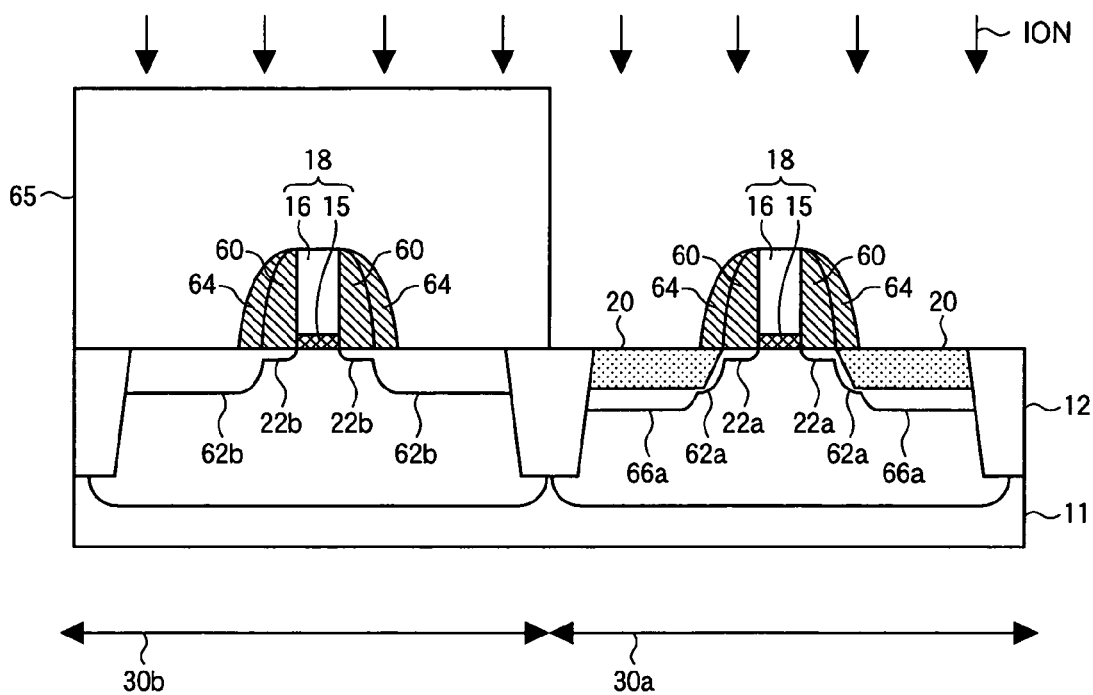
FIG. 27 is a sectional view of a semiconductor device in the step of the semiconductor device fabricating method according to the third embodiment of the present invention (Part 5).

Next, in the step of FIG. 27, a resist film 65 is formed, covering the structure I FIG. 26, and the resist film 65 in the p-MOS region 30a is opened by photolithography. In the p-MOS region 30a, with the gate layer structure 18, the fourth sidewall insulation film 60 and the fifth sidewall insulation film 64 as the mask, a p-impurity is implanted into the silicon substrate 11 on both sides of the fifth sidewall insulation film 64 to thereby form as the source/drain regions 28a somewhat deeper junction regions 66a down to a position which is deeper than the bottom of the compressive stress applying portions 20 of SiGe film. Specifically, the p-impurity is, e.g., $B^+$, the acceleration energy is 8 keV, and the dose is $5\times10^{15}$ $cm^{-2}$. The resist film 61 is removed.

Figure 28:
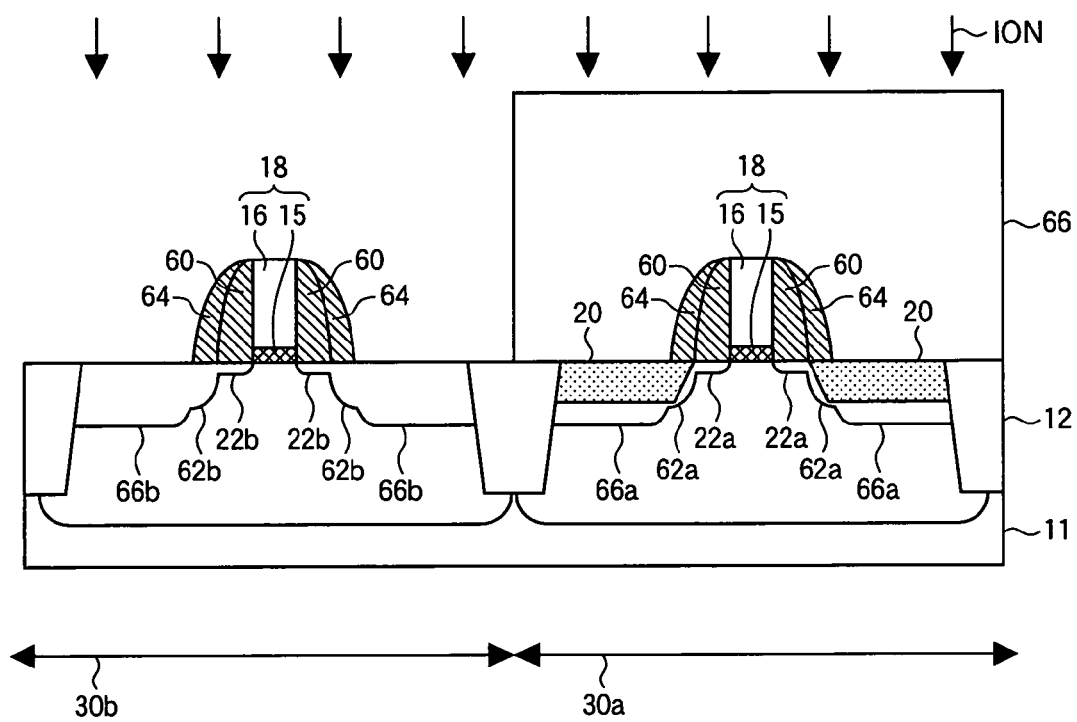
FIG. 28 is a sectional view of a semiconductor device in the step of the semiconductor device fabricating method according to the third embodiment of the present invention (Part 6).

Next, in the step of FIG. 28, in the same way as in the p-MOS region 30a, a resist film 66 is formed, and an opening 41-1 is formed in the resist film 66 in the n-MOS region 30b by photolithography. With the gate layer structure 18, the fourth sidewall insulation film 60 and the fifth sidewall insulation film 64 as the mask, an n-impurity is implanted in the silicon substrate 11 on both sides of the fifth sidewall insulation film 64 to thereby form deep junction regions 66b as the source/drain regions 28b. Specifically, the n-impurity is, e.g., $As^+$ or $P^+$, the acceleration energy is 6 keV, and the dose is $1\times10^{16}$ $cm^{-2}$. Then, the resist film 66 is removed.

Figure 29:
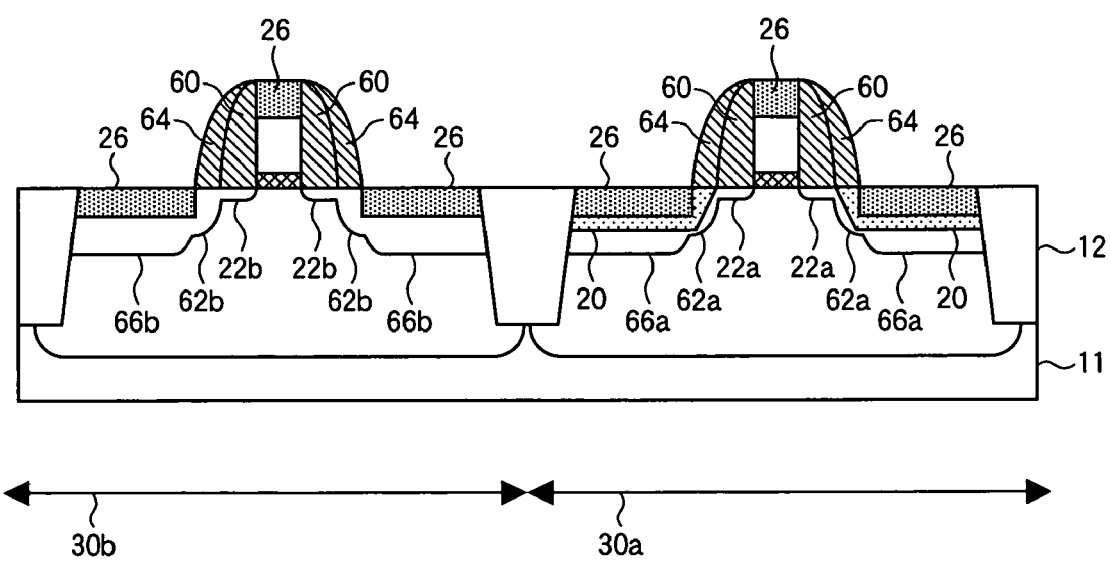
FIG. 29 is a sectional view of a semiconductor device in the step of the semiconductor device fabricating method according to the third embodiment of the present invention (Part 7).

Next, in the step of FIG. 29, the resist film 66 on the structure 41 in the step of FIG. 28 is removed. Then, thermal processing is performed by RTA (Rapid Thermal Annealing) to active the impurities in the shallow junction regions 22a, 22b and he somewhat deeper junction regions 62a, 62b, and the deep junction regions 66a, 66b. Thus, the p-MOS transistor 13a and the n-MOS transistor 13b including the double-step shallow junction regions of the shallow junction regions 22a, 22b and the somewhat deeper junction regions 62a, 62b can be fabricated.

In the step of FIG. 29, furthermore, an Ni film, e.g., a 5 nm-thickness Ni film, Ti film or Co film is formed and silicided by thermal processing to thereby form a silicide film 26, such as $NiSi_2$ film, $TiSi_2$ film, $CoSi_2$ film, on the surface of the silicon substrate 11 in the source/drain regions 28a, 28b and the surface of the gate electrodes 16. The Ni film, Ti film or Co film which has not been silicided is removed.

EXAMPLES

Semiconductor devices (hereinafter called "Examples") each including a p-MOS transistor 13a and an n-MOS transistor 13b were fabricated by the semiconductor device fabricating method according to the first embodiment of the present invention.

As controls, semiconductor devices (hereinafter called "Controls") were fabricated by a semiconductor device fabricating method which is the same as that according to the first embodiment except that the compressive stress applying portions 20 of SiGe are not formed in the p-MOS transistors 13a.

Figure 30:
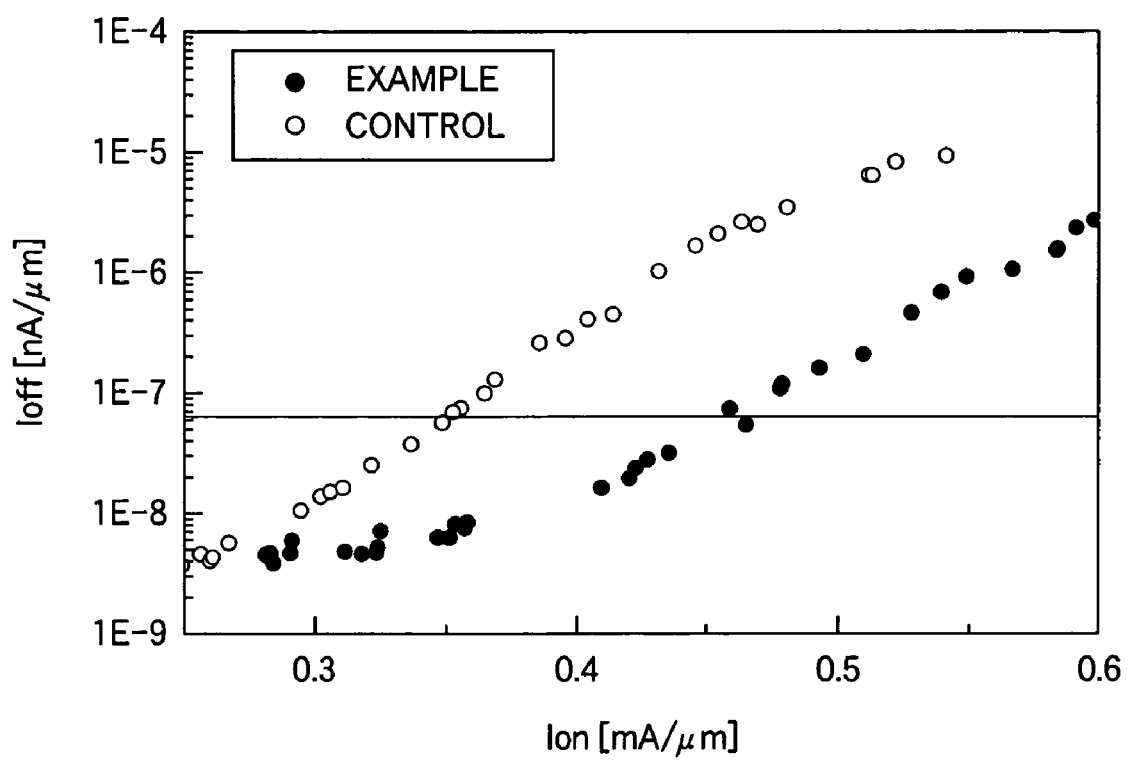
FIG. 30 is a graph of relationships between the turn on current and the turn off current of the p-MOS transistors of Examples and those of Controls.
Figure 31:
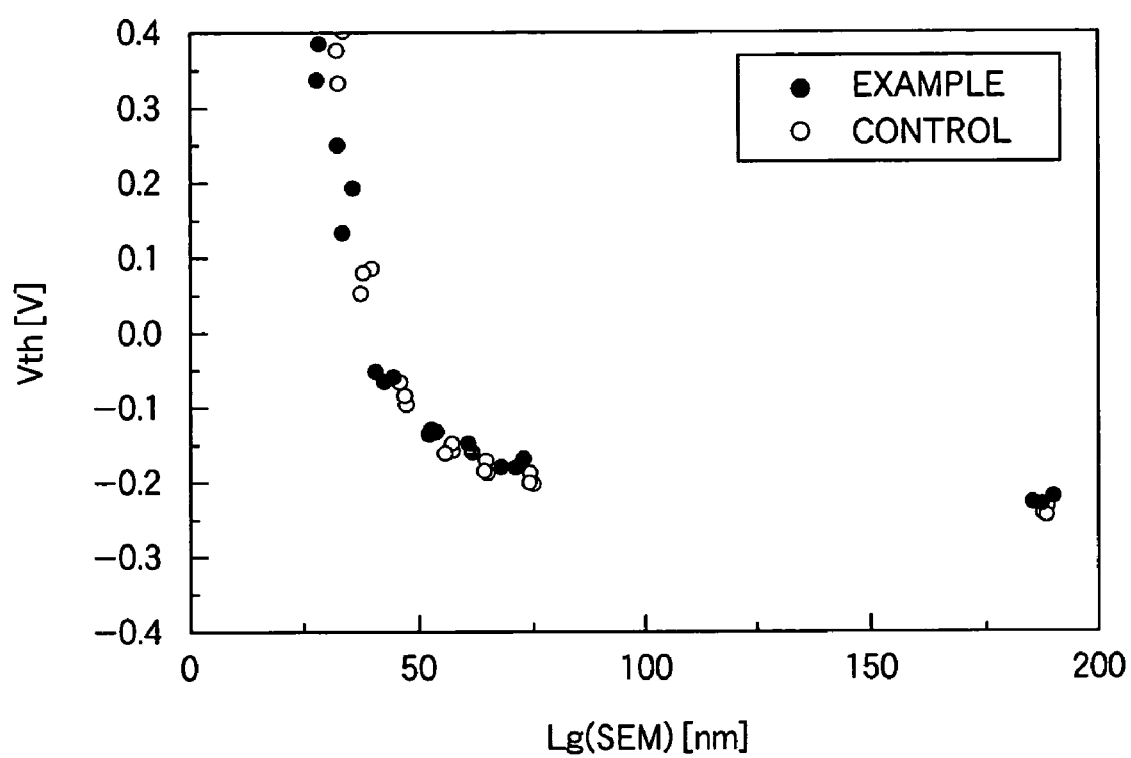
FIG. 31 is a graph of relationships between the gate length and the threshold value of the p-MOS transistors of the Examples and those of the Controls.
Figure 32:
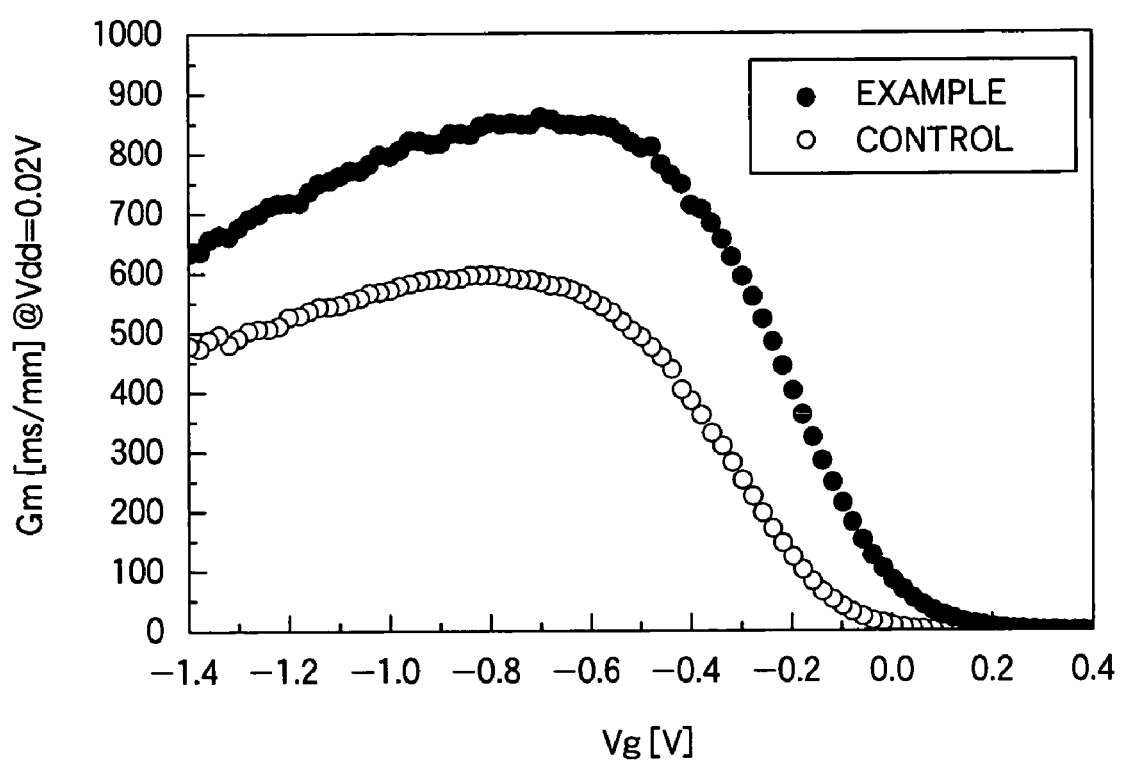
FIG. 32 is a graph of relationships between the gate voltage and the mutual conductance of the p-MOS transistors of the Examples and those of the Controls.

Various electric characteristics were measured on the Examples and the Controls. The results of the measurement are shown in FIGS. 30 to 32. In FIGS. 30 to 32, the ● marks indicate the measurement points of the Examples, and the ○ marks indicate the measurement point of the Controls.

FIG. 30 is a graph of relationships between the turn-on current (Ion) and the turn-off current (Ioff) of the p-MOS transistors of the Examples and the Controls. The ● marks indicate the measurement points of the Examples, and the ○ marks indicate the measurement points of the Controls.

In FIG. 30, when the p-MOS transistors whose turn-off current (Ioff) is about 7E-8 [A/μm] were compared in the turn-on current, the turn-off current of the Controls (○) was about 0.35 [mA/μm], and the turn-off current of the Examples (●) were about 0.46 [mA/μm]. It was found that the present invention improved the turn off current by about 31%.

FIG. 31 is a graph of the gate length Lg (SEM) [nm] and the threshold value Vth [V] of the p-MOS transistors of the respectively Examples and the respective Controls. The ● marks indicate the measurement points of the respective Examples, and the ○ marks indicate the measurement points of the respective Controls.

In the Examples (●), to form SiGe film of the compressive stress applying portions 20, high temperature processing by low pressure thermal CVD with the substrate temperature set at 500-800° C. is necessary (see the step of FIG. 10). The Controls (○) doe not require such high temperature processing.

As seen in FIG. 31, there is no significant difference between the Examples and the Controls, and the high temperature processing for forming the SiGe film does not deteriorate the threshold characteristics of the p-MOS transistors.

FIG. 32 is a graph of relationships between the gate voltage Vg [V] of the p-MOS transistors of the respective Examples and the respective Controls and the mutual conductance Gm [mS/mm] with Vdd being 0.02 V. The ● marks indicate the measurement points of the respective Examples, and the ○ marks indicate the measurements points of the Controls.

In FIG. 32, the p-MOS transistors having a −1.0 [V] gate voltage were compared with each other in the mutual conductance. The mutual conductance of the Controls (○) was about 560 [mS/mm], and that of the Examples (●) were about 800 [mS/mm], and it was found that the present invention improved by about 43%.

Modified Embodiments

Preferably embodiments of the present invention have been detailed above, but the present invention is not limited to the specific embodiments. The present invention can include various modifications which are in the scope of the claims.

For example, in the above-described embodiments, the present invention is explained by means of MOS transistors, but the semiconductor device fabricating method according to the present invention is applicable to MIS transistors. For example, as described above, in place of silicon oxide film of the gate insulation film, silicon oxide nitride film or silicon nitride film may be used. A high-k material, e.g., $Al_2O_3$, $Ta_2O_3$, $HfO_2$, $ZrO_2$, or a metal oxide having perovskite structure, e.g., $PbTiO_3$, $BaTiO_3$, $Pb(Zr, Ti)O_3$ or others may be used.

What is claimed is:

1. A semiconductor device fabricating method for fabricating a semiconductor device including a p-transistor formed in a first region of a semiconductor substrate, and an n-transistor formed in a second region of the semiconductor substrate, comprising the steps of:

forming a first gate layer structure including a gate insulation film and a gate electrode in the first region and a second gate layer structure including a gate insulation film and a gate electrode in the second region;

forming a first sidewall insulation film on both side surfaces of the first gate layer structure;

performing a first surface processing in which $CF_4$ gas and $O_2$ gas are electrolytically dissociated and applied, the second region covered with a resist film, to thereby deform the surface of the semiconductor substrate outer of the first sidewall insulation film in the first region to form a first deformed film thereon;

performing a second surface processing in which $O_2$ gas is electrolytically dissociated and applied to thereby remove the resist film in the second region, and to further deform the first deformed film to form a second deformed film and to oxide the surface of the semiconductor substrate exposed in the second region to form an oxide film thereon;

forming a trench in the semiconductor substrate outer of the first sidewall insulation film with the surface of the semiconductor substrate in the first region with the first gate layer structure and the first sidewall insulation film in the first region and the second gate layer structure and the oxide film in the second region as a mask;

forming a compressive stress applying portion in the trench;

removing the first sidewall insulation film in the first region;

forming a first junction region in the first region and the second region with the first gate layer structure and the second gate layer structure as a mask;

forming a second sidewall insulation film on both side surfaces of the first gate layer structure and a third sidewall insulation film on both side surfaces of the second gate layer structure; and forming a second junction region in the first region and the second region with the first gate layer structure and the second sidewall insulation film and the second gate layer structure and the third sidewall insulation film as a mask.

2. A semiconductor device fabricating method according to claim 1, wherein after the step of forming the first junction region in the first region and the second region and before the step of forming the second sidewall insulation film and the third sidewall insulation film, the method further comprises the steps of;

forming a fourth sidewall insulation film which is thinner than the second sidewall insulation film on both side surfaces of the first gate layer structure, and forming a fifth sidewall insulation film which is thinner than the third sidewall insulation film on both side surfaces of the second gate layer structure; and forming a third junction region which is deeper than the first junction region and shallower than the second junction region, in the first region with the first gate layer structure and the fourth sidewall insulation film as a mask, and in the second region with the second gate layer structure and the fifth sidewall insulation film as a mask.

3. A semiconductor device fabricating method according to claim 1, wherein the step of forming the trench comprises:
anisotropically etching the semiconductor substrate outer of the first sidewall insulation film; and
isotropically etching the semiconductor substrate outer of the first sidewall insulation film.

4. A semiconductor device fabricating method according to claim 3, wherein
the isotropic etching is chemical dry etching using hydrogen chloride gas or chlorine gas.

5. A semiconductor device fabricating method according to claim 3, wherein
the trench is so set that the end of the trench is spaced from the end of the first gate layer structure by 5-80 nm.

6. A semiconductor device fabricating method according to claim 1, wherein
the step of forming a compressive stress applying portions comprises the step of epitaxially growing in the trenches a semiconductor material whose lattice constant is larger than that of a semiconductor forming the semiconductor substrate.

7. A semiconductor device fabricating method according to claim 1,
further comprising, after the step of forming the first gate layer structure and the second gate layer structure, the step of forming a cap layer on the first gate layer structure, and
the step of forming the trench uses the cap layer as a mask for the first gate layer structure.

8. A semiconductor device fabricating method according to claim 7, wherein
in the step of forming the compressive stress applying portion, the cap layer is used as a mask for the first gate layer structure.

9. A semiconductor device fabricating method according to claim 1, wherein
the semiconductor substrate is a silicon substrate, and the compressive stress applying portion is formed of SiGe film or SiGeC film.

10. A semiconductor device fabricating method for fabricating a semiconductor device including a p-transistor formed in a first region of a semiconductor substrate, and an n-transistor formed in a second region of the semiconductor substrate, comprising steps of:
forming a first gate layer structure including a gate insulation film and a gate electrode in the first region and a second gate layer structure including a gate insulation film and a gate electrode in the second region;
forming a first sidewall insulation film on both side surfaces of the first gate layer structure;
forming a trench in the semiconductor substrate outer of the first sidewall insulation film with the surface of the semiconductor substrate in the first region with the first sidewall insulation film as a mask, the second region covered with an etching resistant film;
forming a compressive stress applying portion in the trench;
removing the first sidewall insulation film in the first region;
forming a first junction region in the first region and the second region with the first gate layer structure and the second gate layer structure as a mask;
forming a second sidewall insulation film on both side surfaces of the first gate layer structure and a third sidewall insulation film on both side surfaces of the second gate layer structure; and
forming a second junction region in the first region and the second region with the first gate layer structure and the second sidewall insulation film and the second gate layer structure and the third sidewall insulation film as a mask,
wherein the step of forming the trench comprises:
anisotropically etching the semiconductor substrate outer of the first sidewall insulation film; and
isotropically etching the semiconductor substrate outer of the first sidewall insulation film, and
wherein the trench is so set that the end of the trench is positioned at the outer side of the side surface of the first gate layer structure and that the end of the trench is spaced outward from the side surface of the first gate layer structure by 5-80 nm.

11. A semiconductor device fabricating method according to claim 10, wherein
the step of forming a compressive stress applying portions comprises the step of epitaxially growing in the trenches a semiconductor material whose lattice constant is larger than that of a semiconductor forming the semiconductor substrate.

12. A semiconductor device fabricating method according to claim 10,
further comprising, after the step of forming the first gate layer structure and the second gate layer structure, the step of forming a cap layer on the first gate layer structure, and
the step of forming the trench uses the cap layer as a mask for the first gate layer structure.

13. A semiconductor device fabricating method according to claim 12, wherein
in the step of forming the compressive stress applying portion, the cap layer is used as a mask for the first gate layer structure.

14. A semiconductor device fabricating method according to claim 10, wherein
the semiconductor substrate is a silicon substrate, and the compressive stress applying portion is formed of SiGe film or SiGeC film.

* * * * *